(12) United States Patent
Tran et al.

(10) Patent No.: US 7,268,054 B2
(45) Date of Patent: Sep. 11, 2007

(54) METHODS FOR INCREASING PHOTO-ALIGNMENT MARGINS

(75) Inventors: Luan Tran, Meridian, ID (US); Bill Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/497,490

(22) Filed: Jul. 31, 2006

(65) Prior Publication Data

US 2006/0264002 A1 Nov. 23, 2006

Related U.S. Application Data

(62) Division of application No. 10/931,771, filed on Aug. 31, 2004, now Pat. No. 7,151,040.

(51) Int. Cl.
*H01L 21/76* (2006.01)
(52) U.S. Cl. .................... 438/401; 438/708; 438/947; 257/E21.023
(58) Field of Classification Search ................ 438/708, 438/709, 947, 952
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattascharyya et al. | |

(Continued)

FOREIGN PATENT DOCUMENTS

DE  280851  7/1990

(Continued)

OTHER PUBLICATIONS

Bergeron et al., "Resolution Enhancement Techniques for the 90nm Technology Node and Beyond," *Future Fab International*, Issue 15, 4 pages (Jul. 11, 2003).

(Continued)

*Primary Examiner*—Michael Lebentritt
*Assistant Examiner*—Cheung Lee
(74) *Attorney, Agent, or Firm*—Knobbe, Martens, Olson & Bear LLP

(57) ABSTRACT

Methods and structures are provided for increasing alignment margins when contacting pitch multiplied interconnect lines with other conductive features in memory devices. The portions of the lines at the periphery of the memory device are formed at an angle and are widened relative to the portions of the lines in the array region of the memory device. The widened lines allow for an increased margin of error when overlaying other features, such as landing pads, on the lines. The possibility of contacting and causing electrical shorts with adjacent lines is thus minimized. In addition, forming the portions of the lines in the periphery at an angle relative to the portions of the lines in the array regions allows the peripheral portions to be widened while also allowing multiple landing pads to be densely packed at the periphery.

23 Claims, 34 Drawing Sheets

U.S. PATENT DOCUMENTS

| | | | |
|---|---|---|---|
| 4,838,991 A | 6/1989 | Cote et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,514,885 A | 5/1996 | Myrick | |
| 5,670,794 A | 9/1997 | Manning | |
| 5,753,546 A | 5/1998 | Koh et al. | |
| 5,795,830 A | 8/1998 | Cronin et al. | |
| 5,998,256 A | 12/1999 | Juengling | |
| 6,004,862 A | 12/1999 | Kim et al. | |
| 6,010,946 A | 1/2000 | Hisamune et al. | |
| 6,042,998 A | 3/2000 | Brueck et al. | |
| 6,063,688 A | 5/2000 | Doyle et al. | |
| 6,071,789 A | 6/2000 | Yang et al. | |
| 6,211,044 B1 | 4/2001 | Xiang et al. | |
| 6,291,334 B1 | 9/2001 | Somekh | |
| 6,297,554 B1 | 10/2001 | Lin | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,423,474 B1 | 7/2002 | Holscher | |
| 6,455,372 B1 | 9/2002 | Weimer | |
| 6,475,867 B1 | 11/2002 | Hui et al. | |
| 6,522,584 B1 | 2/2003 | Chen et al. | |
| 6,548,396 B2 | 4/2003 | Naik et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,632,741 B1 | 10/2003 | Clevenger et al. | |
| 6,638,441 B2 * | 10/2003 | Chang et al. | 216/46 |
| 6,673,684 B1 | 1/2004 | Huang et al. | |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,734,107 B2 | 5/2004 | Lai et al. | |
| 6,744,094 B2 | 6/2004 | Forbes | |
| 6,773,998 B1 | 8/2004 | Fisher et al. | |
| 6,794,699 B2 | 9/2004 | Bissey et al. | |
| 6,800,930 B2 | 10/2004 | Jackson et al. | |
| 6,875,703 B1 | 4/2005 | Furukawa et al. | |
| 6,893,972 B2 | 5/2005 | Rottstegge et al. | |
| 6,955,961 B1 | 10/2005 | Chung | |
| 6,962,867 B2 | 11/2005 | Jackson et al. | |
| 2001/0005631 A1 | 6/2001 | Kim et al. | |
| 2002/0042198 A1 | 4/2002 | Bjarnason et al. | |
| 2002/0045308 A1 | 4/2002 | Juengling | |
| 2002/0063110 A1 | 5/2002 | Cantell et al. | |
| 2002/0127810 A1 | 9/2002 | Nakamura et al. | |
| 2003/0006410 A1 | 1/2003 | Doyle | |
| 2003/0044722 A1 | 3/2003 | Hsu et al. | |
| 2003/0119307 A1 | 6/2003 | Bekiaris et al. | |
| 2003/0127426 A1 | 7/2003 | Chang et al. | |
| 2003/0157436 A1 | 8/2003 | Manger et al. | |
| 2003/0207207 A1 | 11/2003 | Li | |
| 2003/0207584 A1 | 11/2003 | Sivakumar et al. | |
| 2003/0230234 A1 | 12/2003 | Nam et al. | |
| 2004/0000534 A1 | 1/2004 | Lipinski | |
| 2004/0018738 A1 | 1/2004 | Liu | |
| 2004/0023475 A1 | 2/2004 | Bonser et al. | |
| 2004/0023502 A1 | 2/2004 | Tzou et al. | |
| 2004/0041189 A1 | 3/2004 | Voshell et al. | |
| 2004/0043623 A1 | 3/2004 | Liu et al. | |
| 2004/0053475 A1 | 3/2004 | Sharma | |
| 2004/0079988 A1 | 4/2004 | Harari | |
| 2004/0106257 A1 | 6/2004 | Okamura et al. | |
| 2004/0235255 A1 | 11/2004 | Tanaka et al. | |
| 2005/0164454 A1 | 7/2005 | Leslie | |
| 2005/0186705 A1 | 8/2005 | Jackson et al. | |
| 2006/0046200 A1 | 3/2006 | Abatchev et al. | |
| 2006/0046201 A1 | 3/2006 | Sandhu et al. | |
| 2006/0046422 A1 | 3/2006 | Tran et al. | |
| 2006/0046484 A1 | 3/2006 | Abatchev et al. | |
| 2006/0211260 A1 | 9/2006 | Tran et al. | |
| 2006/0216923 A1 | 9/2006 | Tran et al. | |
| 2006/0231900 A1 * | 10/2006 | Lee et al. | 257/368 |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bal et al. | |
| 2007/0050748 A1 | 3/2007 | Juengling | |

FOREIGN PATENT DOCUMENTS

| | | |
|---|---|---|
| DE | 42 36 609 A1 | 5/1994 |
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 02/099864 A1 | 12/2002 |
| WO | WO 2004/001799 A2 | 12/2003 |
| WO | WO 2004/003977 A2 | 1/2004 |
| WO | WO 2005/010973 | 2/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of *Proceedings of SPIE: Advances in Resist Technology and Processing XXI*, vol. 5376, John L. Sturtevant, editor, 8 pages (2004).

Chung et al., "Pattern multiplication method and the uniformity of nanoscale multiple lines*," *J. Vac. Sci. Technol.* B21(4), pp. 1491-1495 (Jul./Aug. 2003).

Chung et al. "Nanoscale Multi-Line Patterning Using Sidewall Structure," *Jpn., J. App.. Phys.* vol. 41 Pt. 1, No. 6B, pp. 4410-4414 (2002).

Joubert et al. "Nanometer scale linewidth control during etching of polysilicon gates in high-density plasmas," Microelectronic Engineering 69, pp. 350-357 (2003).

Oehrlein et al. "Pattern transfer into low dielectric materials by high-density plasma etching," Solid State Tech., 8 pages (May 2000).

U.S. Appl. No. 11/543,515, filed Oct. 24, 2006, MICRON Ref. No. 2005-1173.00/US.

Ex Parte Cantell, unpublished decision of the Board of Patent Appeals and Interferences, Mar. 4, 2005.

* cited by examiner

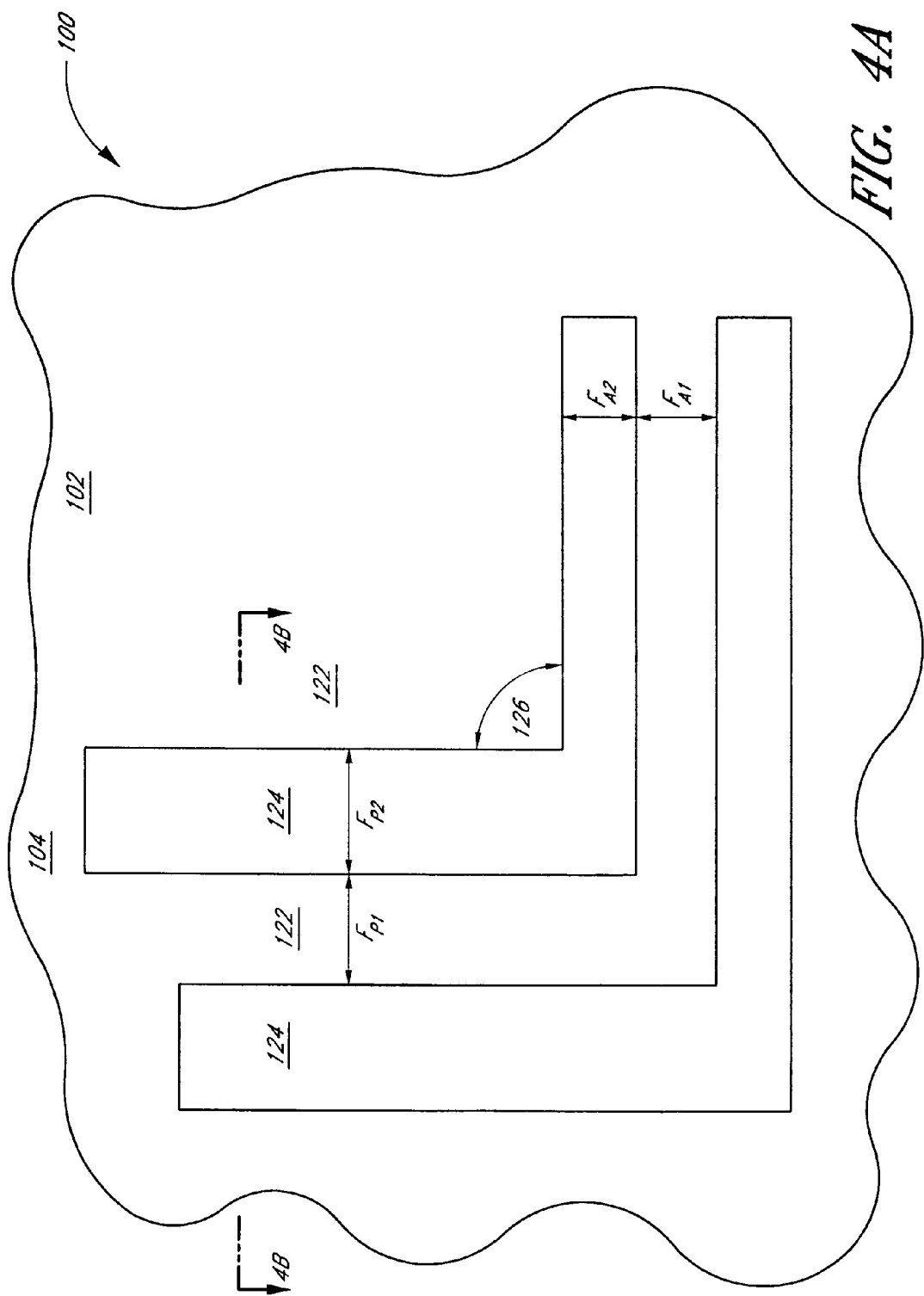

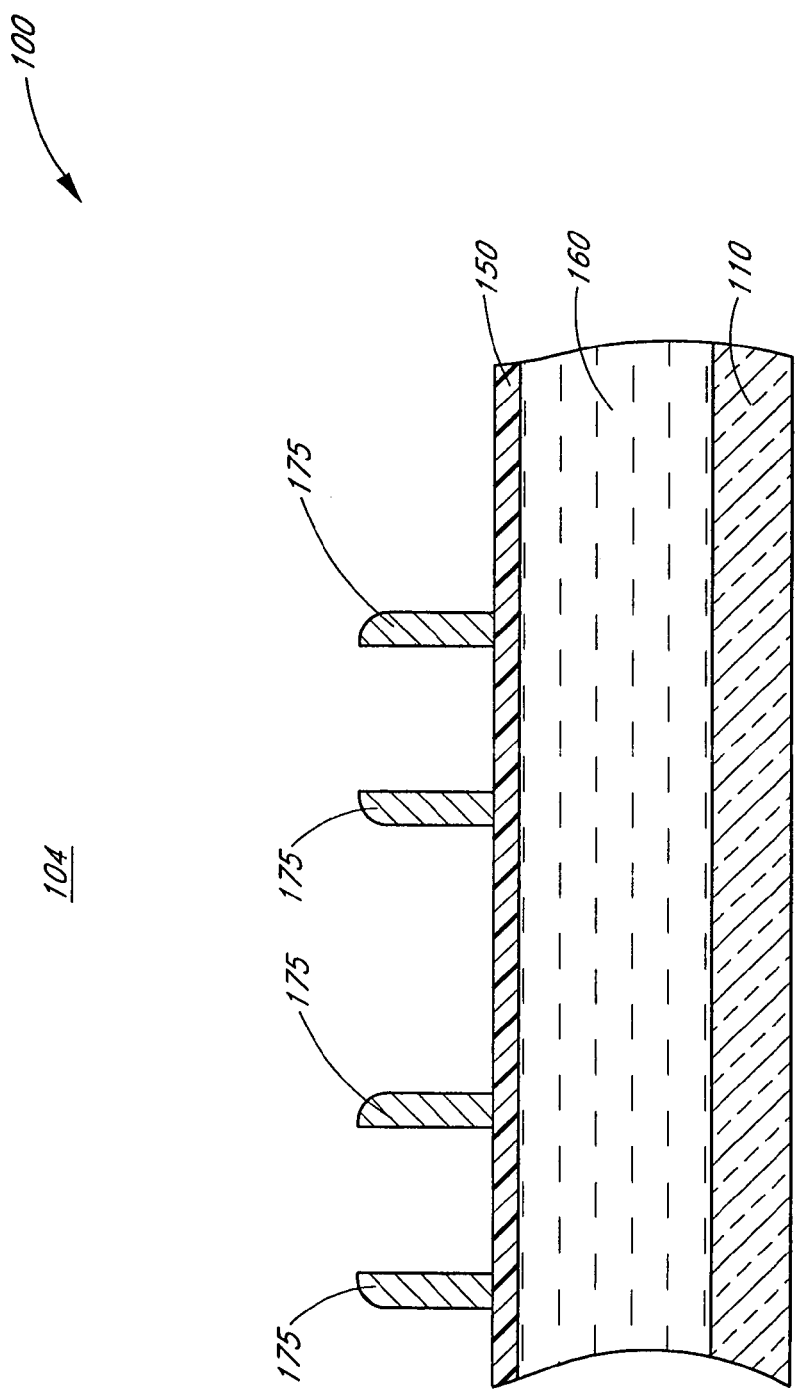

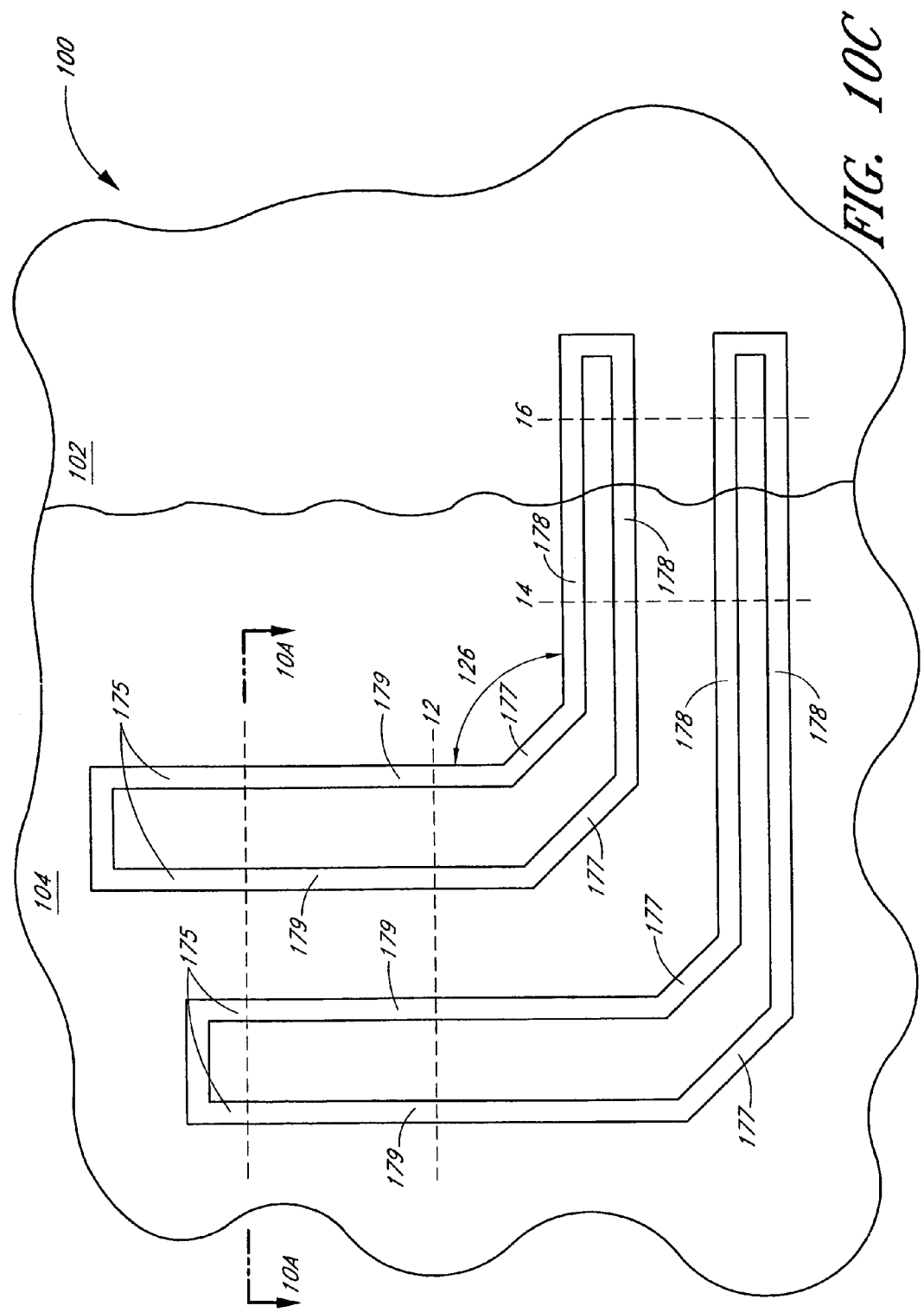

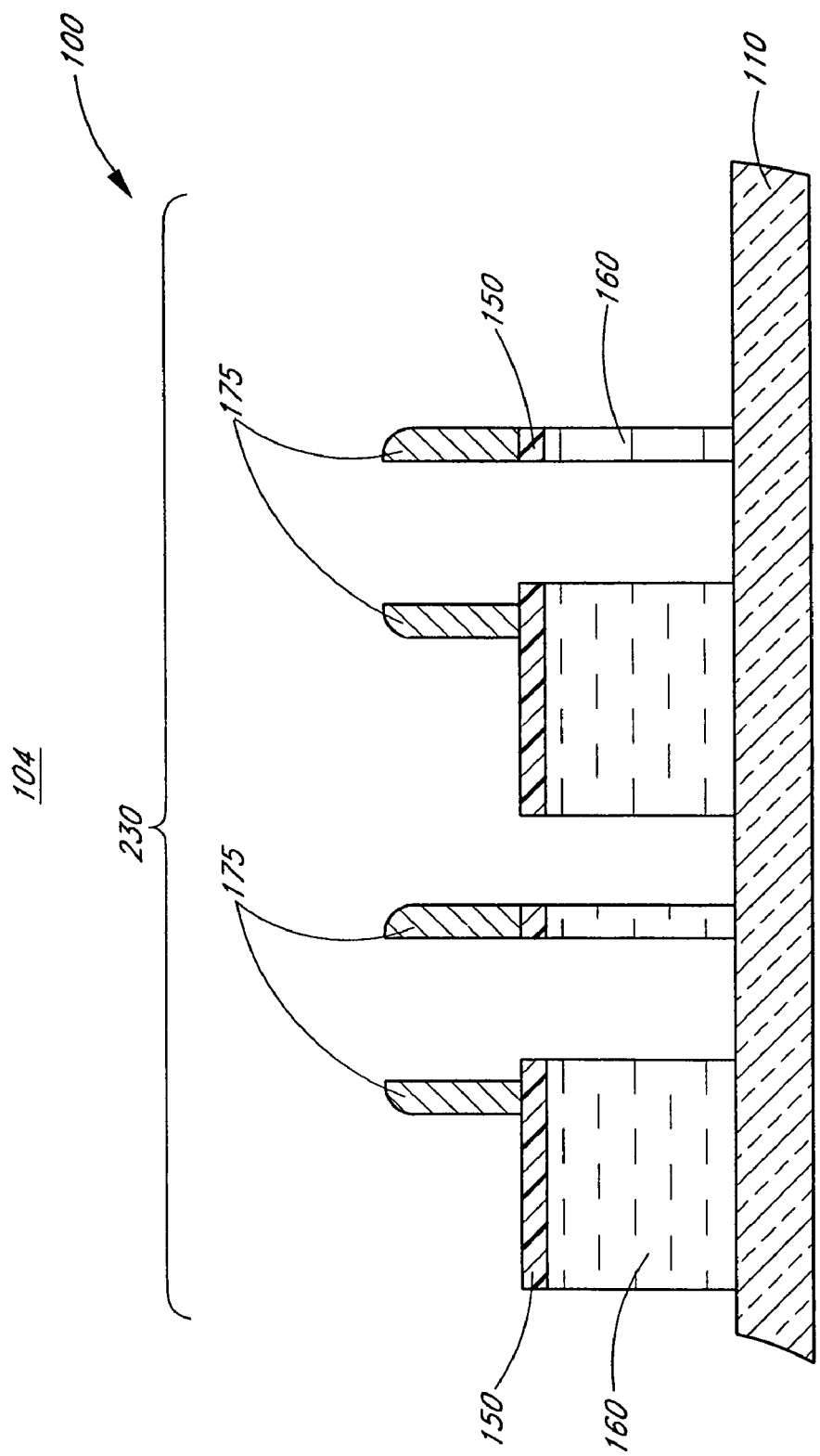

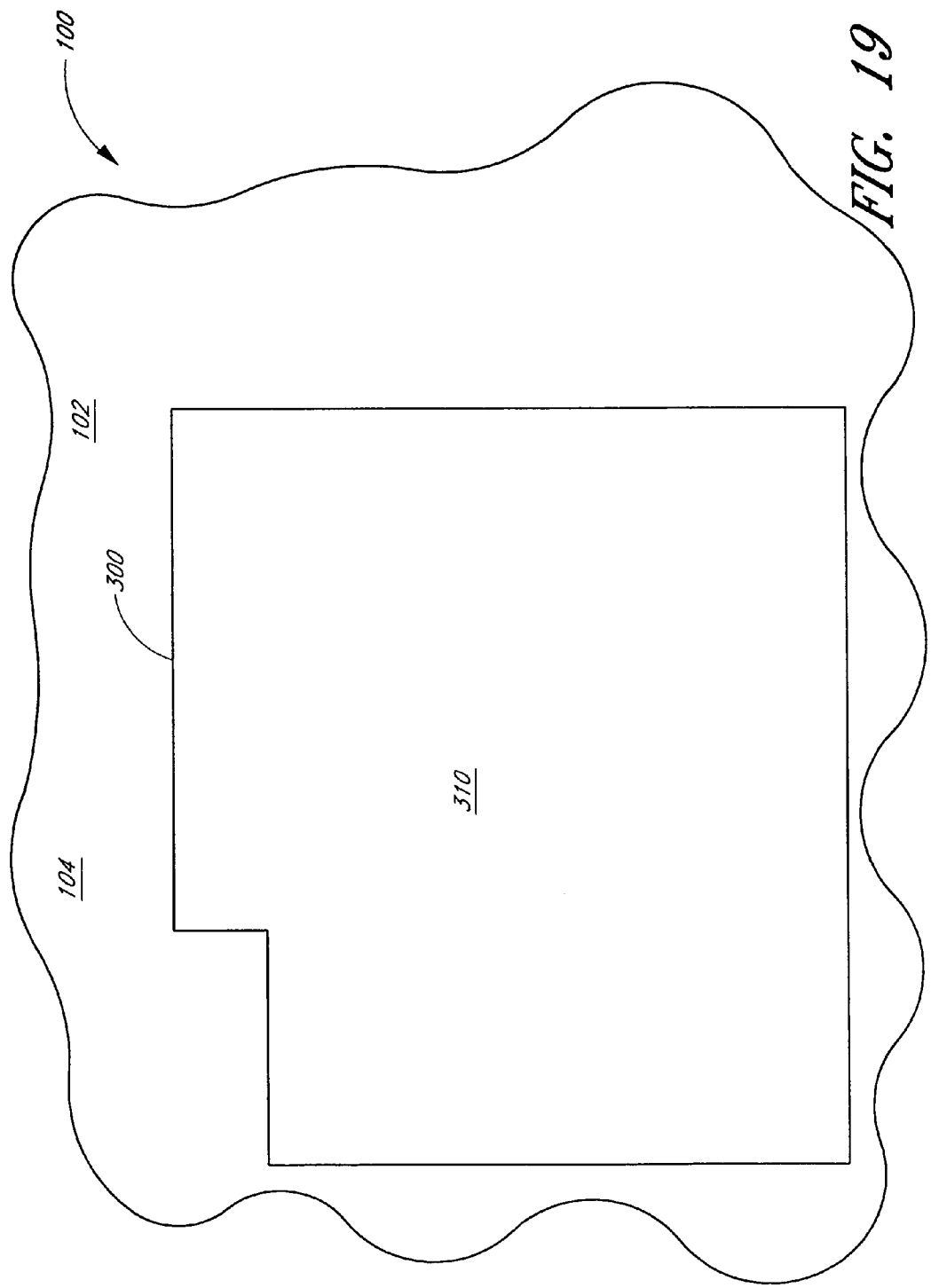

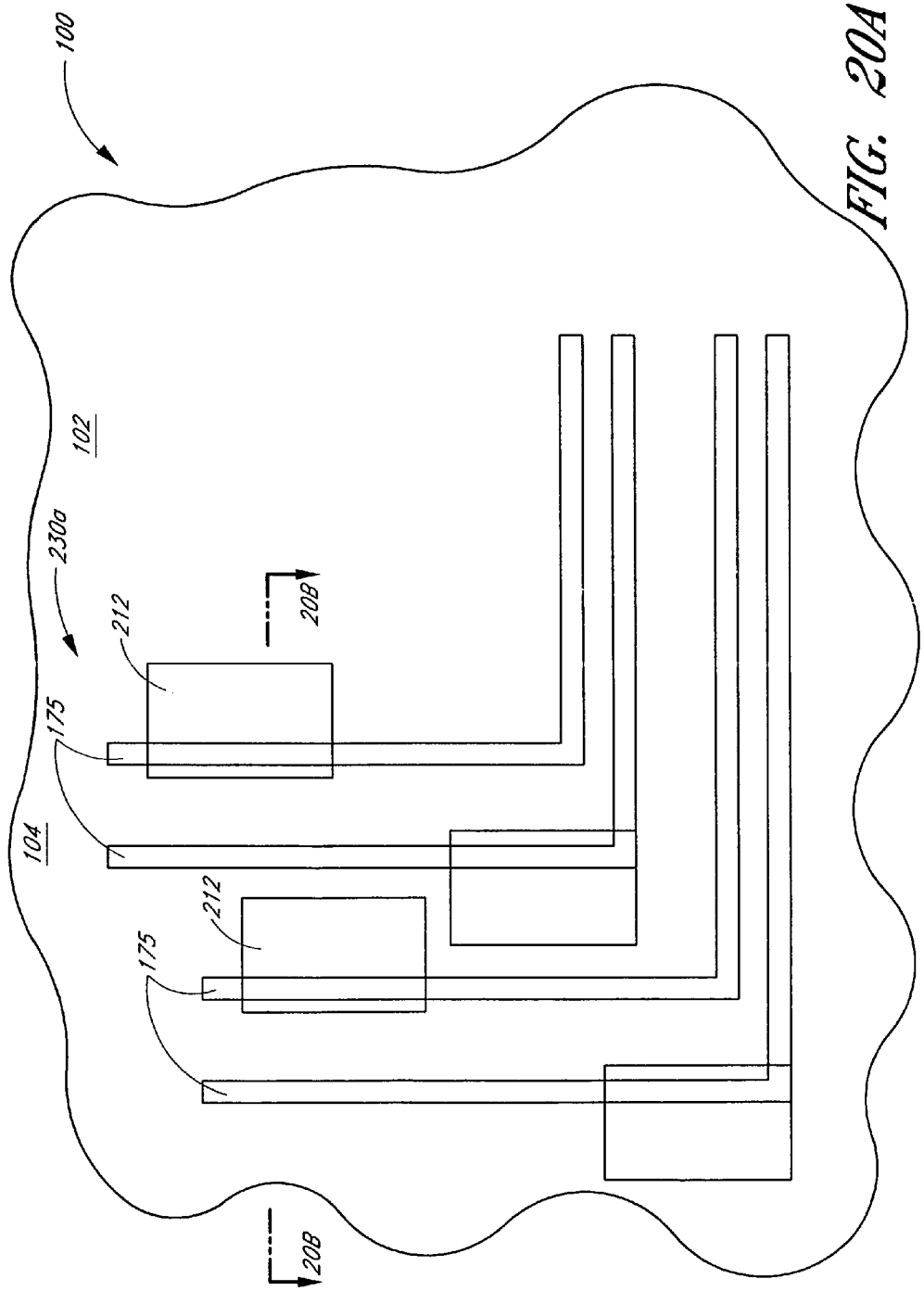

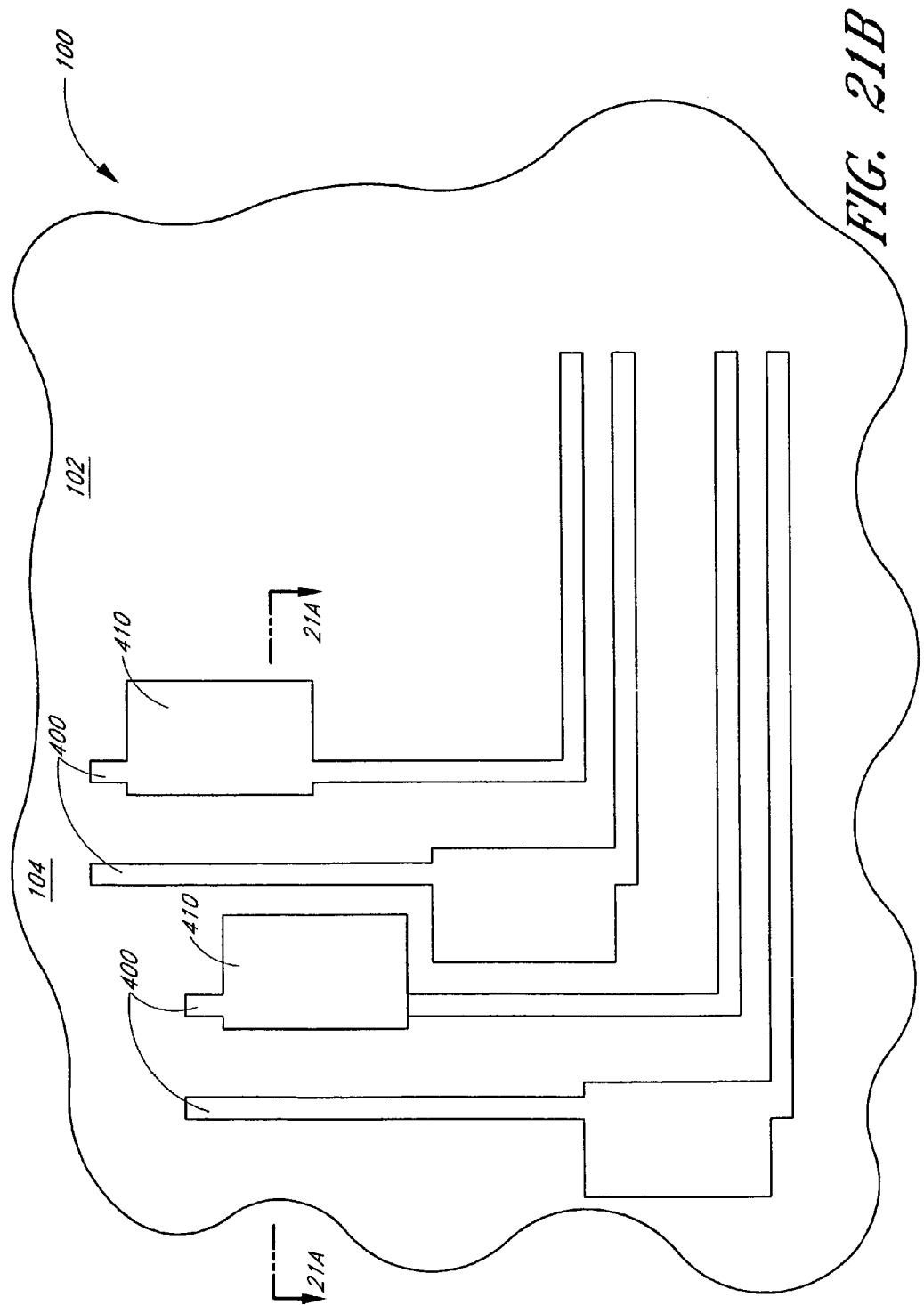

us 7,268,054 B2

METHODS FOR INCREASING PHOTO-ALIGNMENT MARGINS

REFERENCE TO RELATED APPLICATIONS

This application is a divisional of U.S. patent application Ser. No. 10/931,771, filed Aug. 31, 2004 now U.S. Pat. No. 7,151,040.

This application is related to the following: U.S. patent application Ser. No. 10/931,772 to Abatchev et al., filed Aug. 31, 2004, entitled Critical Dimension Control; U.S. patent application Ser. No. 10/932,993 to Abatchev et al., filed Sep. 1, 2004, entitled Mask Material Conversion; U.S. patent application Ser. No. 10/934,778 to Abatchev et al., filed Sep. 2, 2004, entitled Method for Integrated Circuit Fabrication Using Pitch Multiplication; and U.S. patent application Ser. No. 10/934,317 to Sandhu et al., filed Sep. 2, 2004, entitled Methods to Align Mask Patterns.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency in modern electronics, integrated circuits are continuously being reduced in size. To facilitate this size reduction, the sizes of the constituent features, such as electrical devices and interconnect line widths, that form the integrated circuits are also constantly being decreased.

The trend of decreasing feature size is evident, for example, in memory circuits or devices such as dynamic random access memories (DRAMs), static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. By decreasing the sizes of constituent electrical devices and the conducting lines that access them, the sizes of the memory devices incorporating these features can be decreased. Additionally, storage capacities can be increased by fitting more memory cells into the memory devices.

The continual reduction in feature sizes places ever greater demands on techniques used to form the features. For example, photolithography is commonly used to pattern features, such as lines, on a substrate. The concept of pitch can be used to describe the size of these features. Pitch is defined as the distance between an identical point in two neighboring features. These features are typically defined by openings in, and spaced from each other by, a material, such as an insulator or conductor. As a result, pitch can be viewed as the sum of the width of a feature and of the width of the space separating that feature from a neighboring feature. The width of the line can also be referred to as the critical dimension or feature size (F) of the line. Because the width of the space adjacent that line is typically equal to the width of the line, the pitch of lines is typically two times the feature size (2F).

Due to factors such as optics and light or radiation wavelength, however, photolithography techniques each have a minimum pitch below which a particular photolithographic technique cannot reliably form features. Thus, the minimum pitch of a photolithographic technique can limit feature size reduction.

"Pitch doubling" is one method proposed for extending the capabilities of photolithographic techniques beyond their minimum pitch. Such a method is illustrated in FIGS. 1A-1F and described in U.S. Pat. No. 5,328,810, issued to Lowrey et al., the entire disclosure of which is incorporated herein by reference. With reference to FIG. 1A, photolithography is first used to form a pattern of lines 10 in a photoresist layer overlying a layer 20 of an expendable material and a substrate 30. As shown in FIG. 1B, the pattern is then transferred by an etch step (preferably anisotropic) to the layer 20, forming placeholders or mandrels 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60 are then formed on the sides of the mandrels 40 by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch formerly included a pattern defining one feature and one space (each having a width equal to F, for a pitch equal to 2F), the same width now includes two features and two spaces defined by the spacers 60 (each of which have a width equal to ½ F). As a result, the smallest feature size possible with a photolithographic technique is effectively decreased.

It will be appreciated that while the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. The conventional terminology is retained herein. Note that by forming spacers upon spacers, the definable feature size can be further decreased. Thus, pitch multiplication refers to the process generally, regardless of the number of times the spacer formation process is employed.

Feature sizes of contacts to the pitch multiplied lines are typically larger than the lines themselves and, so, can be formed by conventional photolithographic techniques. Such contacts can include landing pads or regular line width, e.g., non-pitch multiplied, interconnects. The pitch multiplied lines, however, can have pitches below the minimum pitch for a given photolithographic technique. Consequently, the separation between the lines can be smaller than the precision of the photolithographic technique used to pattern the landing pads or regular line width interconnects. As a result, the landing pads or regular line width interconnects can inadvertently contact two or more different lines, or might not adequately contact their intended line at all. Thus, due to resolution limitations, reliably making connections to small pitch multiplied lines is beyond the capability of many photolithographic techniques.

Accordingly, there is a need for methods of making connections to small conducting lines, especially conducting lines formed by pitch multiplication.

SUMMARY OF THE INVENTION

According to one aspect of the invention, a method is provided for manufacturing a memory device. The method comprises forming a plurality of spaced, removable mandrel strips. The mandrel strips are separated by a first width in an array region of the memory device and a second width in a periphery of the memory device. The second width is greater than the first width and a portion of the mandrel strips in the array region extends at an angle relative to an other portion of the mandrel strips in the periphery. The method also comprises forming a spacer on sidewalls of each mandrel strip. The spacer forms a loop around a perimeter of each mandrel strip.

According to another aspect of the invention, a method is provided for fabricating an integrated circuit. The method comprises patterning a plurality of pairs of mask lines. Each pair of the mask lines forms a continuous loop. The method also comprises contacting conductive lines defined by the mask lines with contact structures. Each contact structure contacts a different conductive line.

According to yet another aspect of the invention, a method is provided for forming an integrated circuit. The method comprises providing a substrate having an overlying mask layer and a first photodefinable layer overlying the mask layer. A first pattern is formed in the first photodefinable layer. A second pattern is formed in the mask layer based upon the first pattern. A second photodefinable layer is formed over the mask layer. A third pattern is formed in the second photodefinable layer and transferred to the mask layer. A third photodefinable layer is formed over the mask layer and a fourth pattern is formed in the third photodefinable layer. At least the second pattern and the third pattern are then simultaneously transferred to the substrate.

According to another aspect of the invention, a method is provided for semiconductor fabrication. The method comprises forming a first pattern of mask lines over a substrate by pitch multiplication. Portions of the lines extend in spaced, generally parallel relation to one another between first and second spaced planes extending perpendicular to the lines and other portions of the lines extend between third and fourth spaced planes extending perpendicular to the lines. The portions of the lines are at an angle relative to the other portions of the lines. The method also comprises separately forming a second pattern in a photodefinable material by photolithography without pitch multiplication. A remaining portion of the photodefinable material after forming the second pattern overlaps a location of at least some of the mask lines.

According to yet another aspect of the invention, a process is provided for forming an integrated circuit. The process comprises forming a plurality of mask lines forming closed loops. A distance between neighboring mask lines at one end of the loops is less than an other distance between neighboring mask lines at an other end of the loops. The method also comprises forming a layer of a photodefinable material over the mask lines. The ends of the closed loops extend laterally beyond boundaries of the layer of the photodefinable material.

According to another aspect of the invention, a partially formed integrated circuit is provided. The partially formed integrated circuit comprises a plurality of patterned mask lines which form closed loops. A photodefinable material overlies the mask lines and the ends of the closed loops extend laterally beyond boundaries of the photodefinable material. A distance between neighboring mask lines at one end of the loops is less than an other distance between neighboring mask lines at an other end of the loops.

According to another aspect of the invention, an integrated circuit is provided. The integrated circuit comprises a regularly repeating plurality of electrical devices arranged in an array and a plurality of conductive interconnects connecting electrical devices of the array. Each interconnect has a width and portions of the interconnects extend in spaced, generally parallel relation to one another between first and second spaced planes extending perpendicular to the interconnects and other portions of the interconnects extend in spaced, generally parallel relation to one another between third and fourth spaced planes extending perpendicular to the interconnects. The portions of the interconnects are at an angle relative to the other portions of the interconnects and the other portions of the interconnects are outside the array. The integrated circuit also comprises a plurality of contact structures. Each contact structure has a minimum dimension and at least one contact structure contacts each of the interconnects between the third and the fourth spaced planes.

According to yet another aspect of the invention, a memory device is provided. The memory device comprises an array region comprising a plurality of memory cells arranged in rows. Each of a plurality of conductive lines connect a row of memory cells. The memory device also comprises a periphery region comprising landing pads. Each landing pad is in contact with one of the plurality of conductive lines. The conductive lines occupy both the array region and the periphery region and a spacing between neighboring conductive lines in the periphery region is greater than a spacing between neighboring conductive lines in the array region.

BRIEF DESCRIPTION OF THE DRAWINGS

The invention will be better understood from the Detailed Description of the Preferred Embodiments and from the appended drawings, which are meant to illustrate and not to limit the invention, and wherein:

FIGS. 4A-4B are schematic, top plan and cross-sectional side views, respectively, of the partially formed memory device of FIGS. 3A and 3B after forming lines in a photodefinable layer in the periphery of the memory device, in accordance with preferred embodiments of the invention;

FIG. 10A is a schematic, cross-sectional side view of the partially formed memory device of FIG. 9 after removing a remaining portion of the temporary layer to leave a pattern of spacers, in accordance with preferred embodiments of the invention;

FIG. 10C is a schematic, top plan view of the partially formed memory device of FIG. 10A, in accordance with other preferred embodiments of the invention;

FIGS. 16A-16B are schematic, cross-sectional side and top plan views, respectively, of the partially formed memory device of FIG. 15 after transferring the landing pad pattern and the spacer pattern together to an additional hard mask layer, in accordance with preferred embodiments of the invention;

FIG. 19 is a schematic, top plan view of the partially formed memory device of FIG. 18 after etching exposed portions of spacers, in accordance with preferred embodiments of the invention;

FIGS. 20A and 20B are schematic, top plan and cross-sectional side views, respectively, of the partially formed memory device of FIG. 19 after removing the protective layer, in accordance with preferred embodiments of the invention; and FIGS. 21A-21B are schematic, cross-sectional side and top plan views, respectively, of the partially formed memory device of FIGS. 20A-20B after transferring the landing pad and spacer pattern to the substrate, in accordance with preferred embodiments of the invention.

DETAILED DESCRIPTION OF THE PREFERRED EMBODIMENTS

Figure 1A:
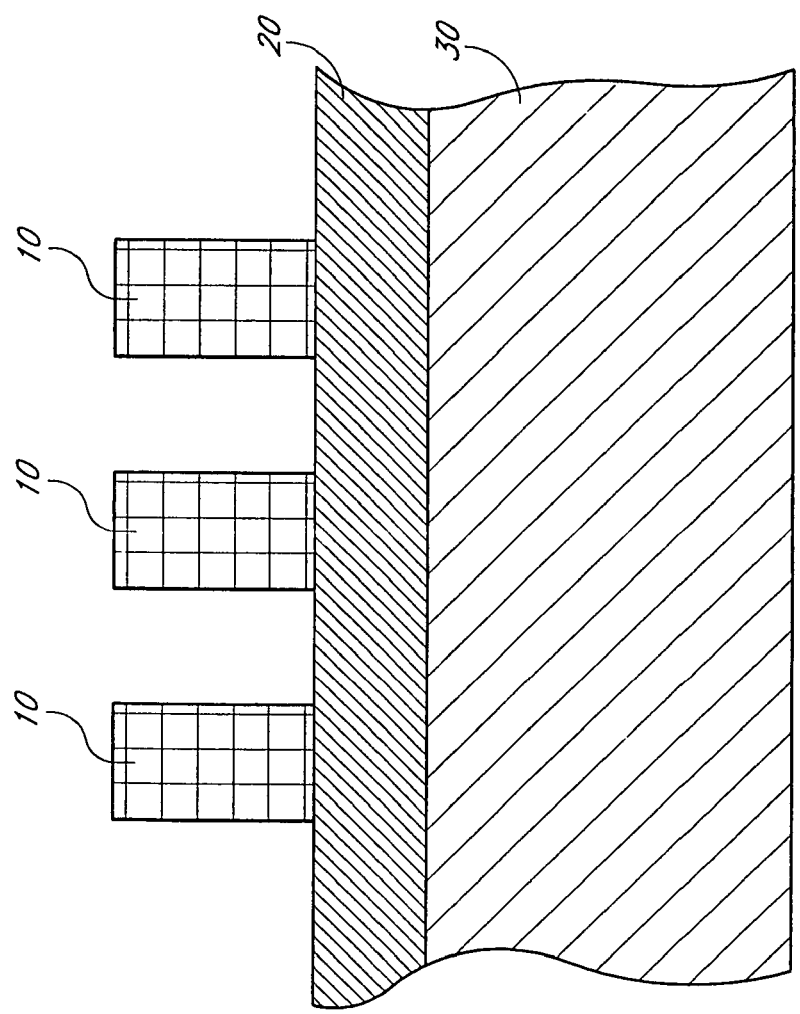
FIGS. 1A-1F are schematic, cross-sectional side views of mask lines, formed in accordance with a prior art pitch multiplication method.
Figure 1B:
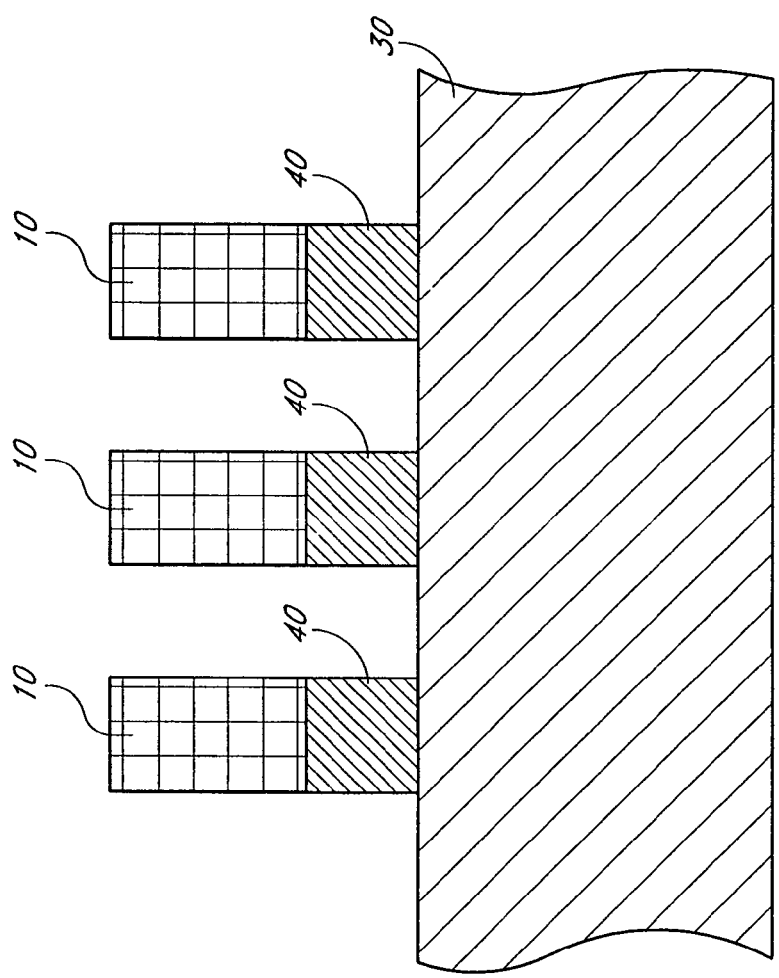
Figure 1C:
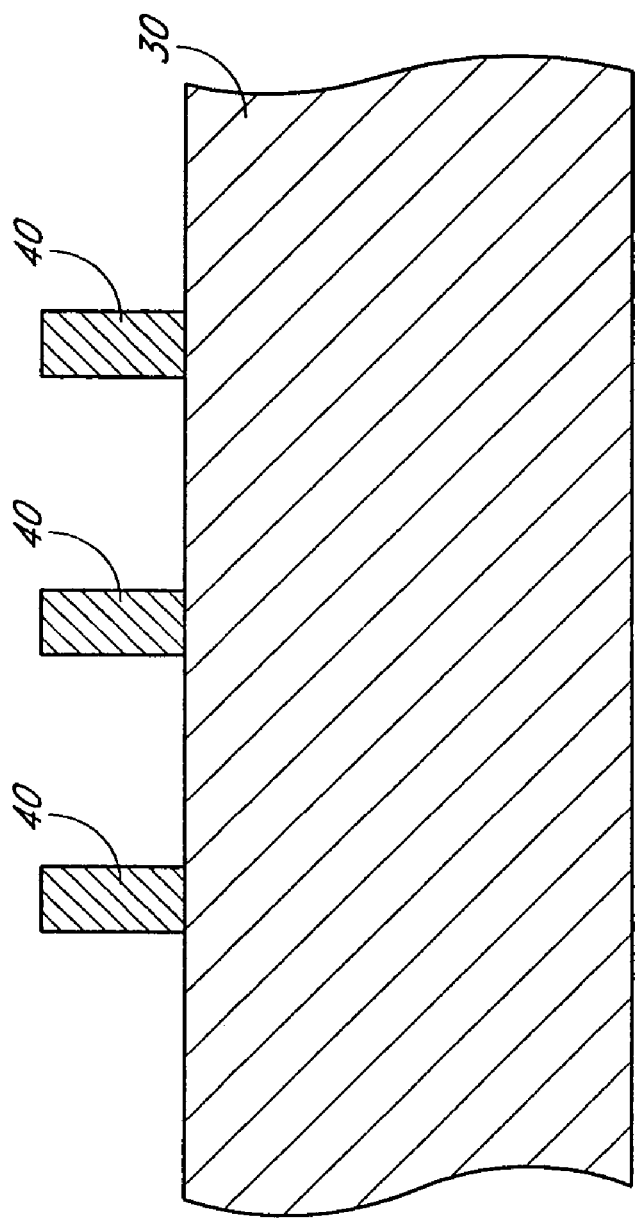
Figure 1D:
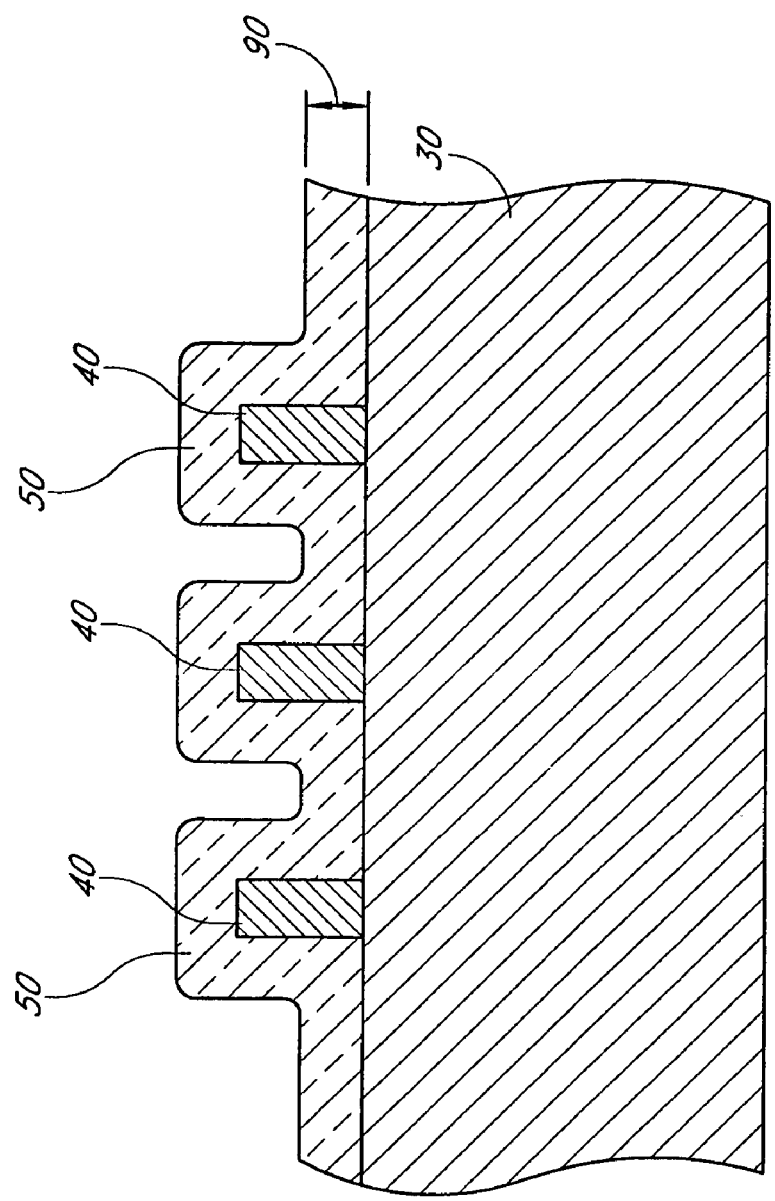
Figure 1E:
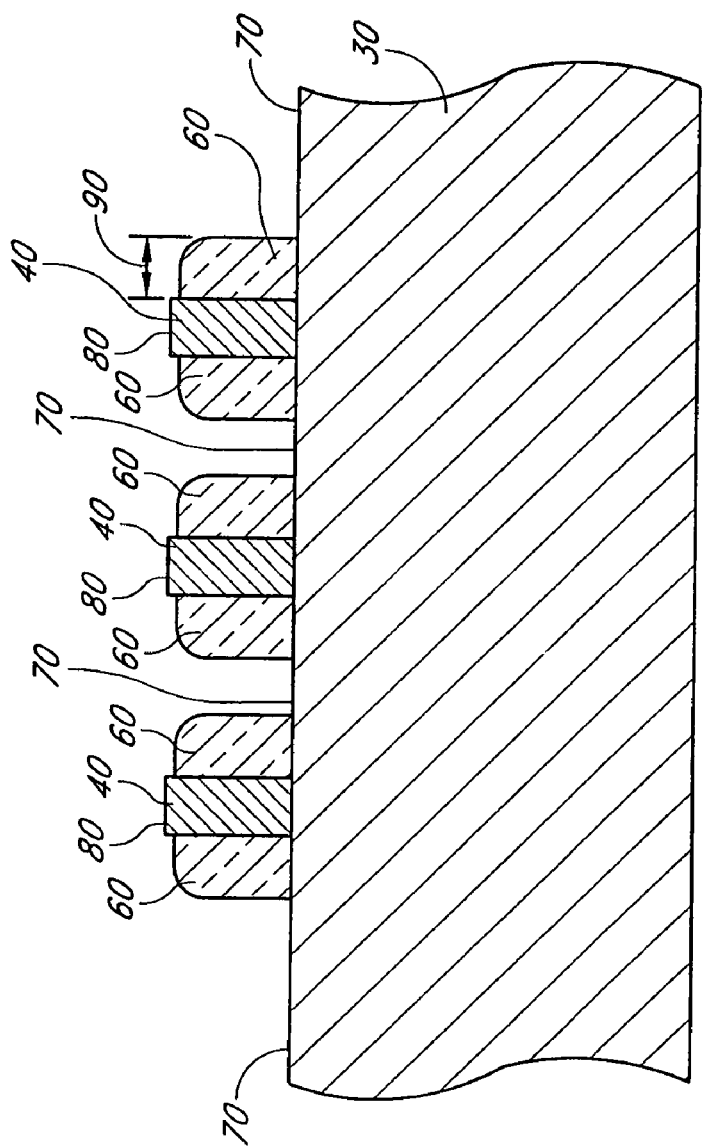
Figure 1F:
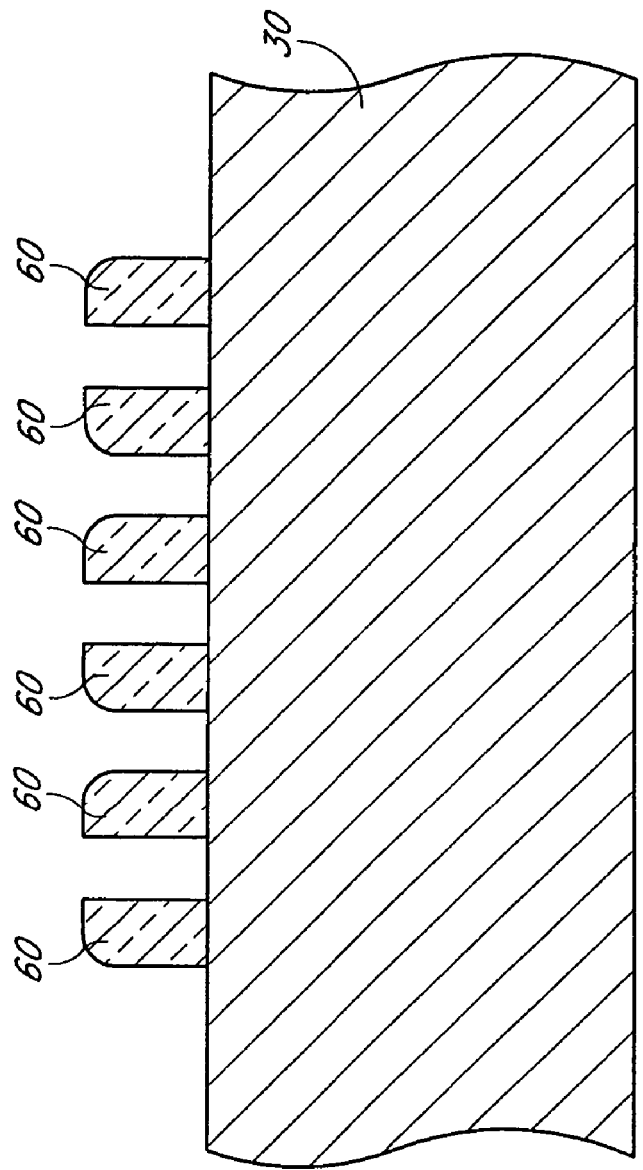
Figure 2A:
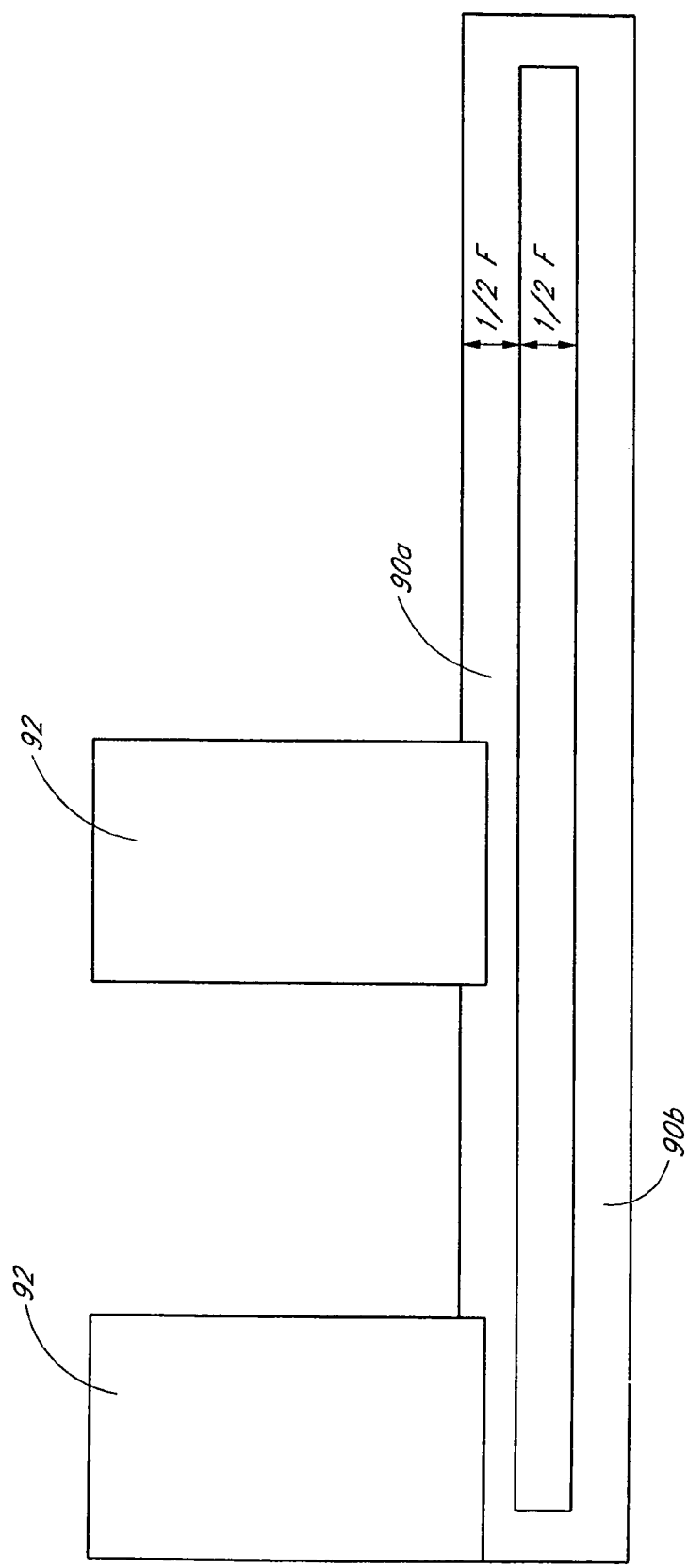
FIGS. 2A-2B are schematic, top plan views illustrating margins of error available for forming contacts to pitch multiplied lines.
Figure 2B:
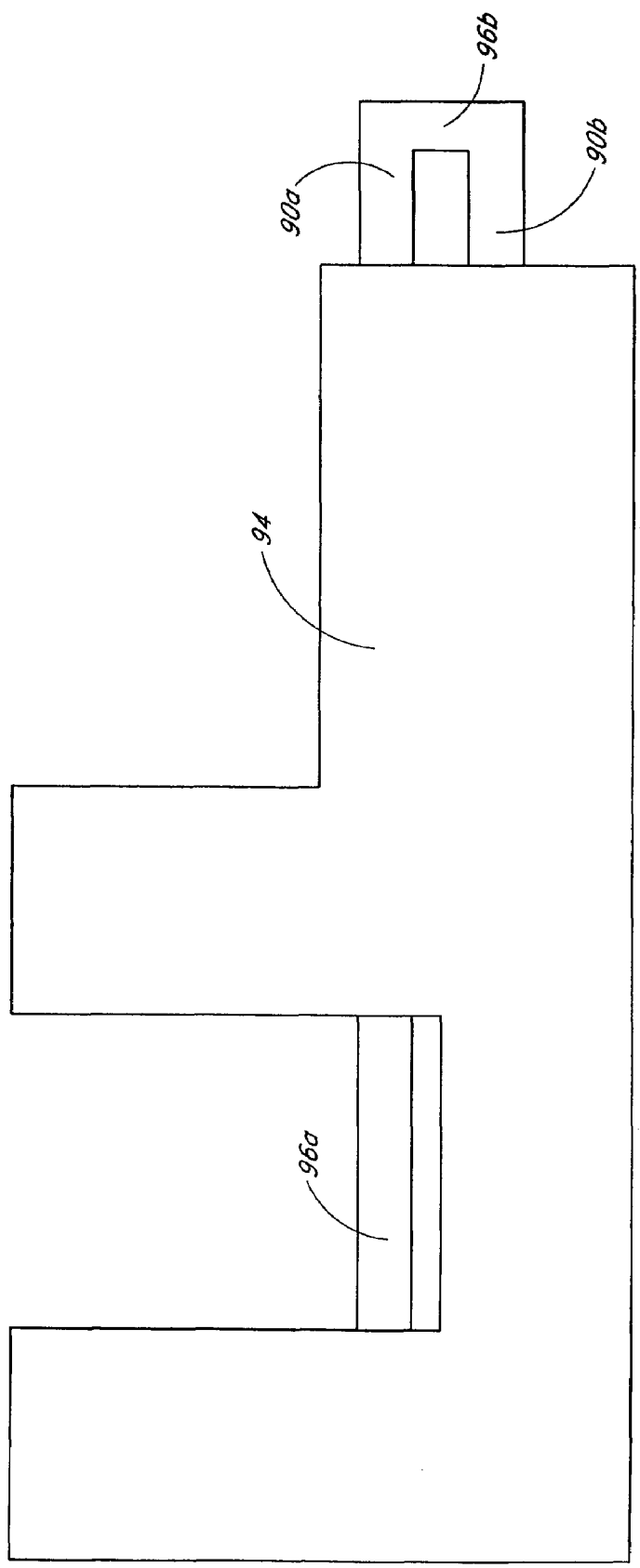

Various types of misalignments have been found to occur when forming contacts to pitch doubled lines. As shown in FIGS. 2A and 2B, if 2F is the minimum pitch of the photolithographic technique used for patterning photoresist to form a contact and the lines 90$a$ and 90$b$ have been pitch-doubled, then the width of the lines and the spaces separating the lines may be, as an example, ½ F. Given this small feature size, one type of misalignment can occur due to difficulties in accurately overlaying mask features 92, for forming contacts, on lines 90$a$ and 90$b$. If the features 92 cannot be overlaid on lines 90$a$ with a tolerance of less than ¼ F, they may form an electrical short with the neighboring line 90$b$ or they may not contact the line 90$a$ at all. Because F is at the lower limits of the resolution of the photolithographic technique, however, patterning the contacts 90 with an accuracy of ¼ F of the line 90$a$ can be difficult, if not impossible. This difficulty is exacerbated because the lines 90$a$ and 90$b$ are themselves formed with a certain margin of error. As a result, the margin of error for forming the features 92 is undesirably small and the features 92 may cause shorts or fail to make contact at all with the line 90$a$. As used herein, it will be appreciated that a "feature" refers to any volume or opening formed in a material, e.g., in a mask layer or in the substrate, and having discrete boundaries.

As shown in FIG. 2B, another type of misalignment can occur when forming individual lines out of the connected lines 90$a$ and 90$b$. It will be appreciated that pitch doubling typically forms loops as a result of spacer formation around a photoresist-defined feature; as illustrated in both FIGS. 2A and 2B, the lines 90$a$ and 90$b$ are connected at their ends. These lines, however, are typically used to define conductive features that connect different electrical devices and, so, should be electrically isolated. To electrically disconnect the lines 90$a$ and 90$b$, a mask 94 can be used to protect the areas to be retained. The exposed portions 96$a$ and 96$b$ of the line are then etched away. To ensure that the portion 96$a$ is etched, the mask 94, like the features 92 in FIG. 2B, should be placed accurately relative to the line 90$a$. It will be appreciated that the mask 94 is typically defined by photolithography and, as a result, the difficulties associated with placing the features 92 are also present when defining the edges of the mask 94. Consequently, it is possible that the mask may not leave all of portions 96$a$ or 96$b$ exposed for a subsequent etch, thereby causing a short between lines 90$a$ and 90$b$. Thus, it will be appreciated that for tightly spaced lines such as pitch multiplied lines, the margin of error for forming the mask 94 is undesirably small.

Advantageously, preferred embodiments of the invention allow for increased tolerances in forming contacts and in separating mask features that are formed, e.g., by pitch multiplication. It will be appreciated that pitch multiplied mask features are typically closed loops at some point in the masking process, e.g., two neighboring lines connected together at their ends. In preferred embodiments, the spacing between neighboring features, e.g., the lines forming a closed loop, is increased in portions of the loop where a contact to the lines will be formed. The portions with widened spacing can be located in, e.g., the periphery of a memory device, while the lines in the array region of the memory device are more narrowly spaced. Advantageously, this widening of the space between the lines allows for an increased margin of error for forming contacts to the lines. For example, the amount by which the contact can be mis-aligned before shorting a neighboring line can be increased by the amount that the spacing between the lines is increased. Advantageously, the spacing between the features can be tailored to the requirements and tolerances of a particular photolithographic technique, if desired.

In addition, the portions of the lines that are widened, e.g., in the periphery of a memory device, are preferably formed at an angle relative to the other portions of the lines, e.g., in the array region of a memory device. Moreover, the angle is preferably similar for both lines of a loop formed by pitch multiplication. Advantageously, this angling allows the points of contact, including landing pads and contact points for other interconnects, to be more closely packed together than if the lines continue to extend parallel to portions of the line without contact points, e.g., in the array region of a memory device. Such an arrangement also allows more close packing than if each of the lines extends in a different direction, e.g., if one of the lines of a loop extends at less than 180° and the other extends at more than a 180° angle relative to portions of the line in the array.

Preferably, the mask features to be overlaid with other features correspond to conductive interconnects in an integrated circuit, e.g., a memory chip. In such cases, the mask features are preferably mask lines or other features that serve to pattern a substrate. The lines are preferably formed by pitch multiplication by patterning a first photodefinable layer. The features to contact and/or modify the lines are then overlaid on the lines by patterning a second photodefinable layer overlying the lines. In cases where the lines are used to form conductive features such as interconnects, the lines that form a closed loop can be modified to electrically separate the lines and form two or more separate conductive paths. For this electrical separation, a third photodefinable layer is preferably patterned to form a protective mask over parts of the lines that are to be retained. The exposed parts of the lines are then etched away to separate the lines. This separation of the lines can performed while the lines are lines in a mask or hard mask layer or after the lines have been transferred to the substrate.

In other embodiments, the electrical separation of the lines can be accomplished by forming electrical devices, such as transistors, in the path of the lines. In such cases, operation of the electrical device can be used to selectively electrically isolate the lines, as desired.

It will be appreciated that the "substrate" containing the conductive lines can comprise any material or materials that are to be processed through an overlying mask layer and that comprises material that ultimately forms part of the integrated circuit being fabricated. Thus, a substrate can include a layer of a single material, a plurality of layers of different materials, a layer or layers having regions of different materials or structures in them, etc. These materials can include semiconductors, insulators, conductors, or combinations thereof.

Preferably, the substrate comprises a conductor suitable for acting as electrical interconnects between electrical devices. For example, the substrate can comprise doped polysilicon, an electrical device active area, a silicide, or a metal layer, such as a tungsten, aluminum or copper layer, or a combination thereof. Thus, the mask lines can directly correspond to the desired placement of interconnects in the substrate. In other embodiments, the substrate can be an insulator.

Reference will now be made to the Figures, wherein like numerals refer to like parts throughout. It will be appreciated that FIGS. 2A-21B are not necessarily drawn to scale.

It will be appreciated that while the preferred embodiments will find application in any context in which features from different mask patterns are overlaid one other, in particularly advantageous embodiments, features formed by pitch multiplication or employing spacers on soft or hard masks are "stitched" or aligned with features formed by a masking technique with a lower resolution. Preferably, pitch multiplied mask features are made to contact features formed by conventional photolithography. Thus, the pitch multiplied features preferably have a pitch below the minimum pitch of the photolithographic technique used for patterning the other features. In addition, while the preferred embodiments can be used to form any integrated circuit, they are particularly advantageously applied to form devices having arrays of electrical devices, including integrated circuits having logic or gate arrays and volatile and non-volatile memory devices such as DRAM, ROM or flash memory. Advantageously, the pitch multiplied mask features can be used to form word lines, bit lines or active areas that are part of a continuous straight linear or irregular weaving pattern.

Figure 3A:
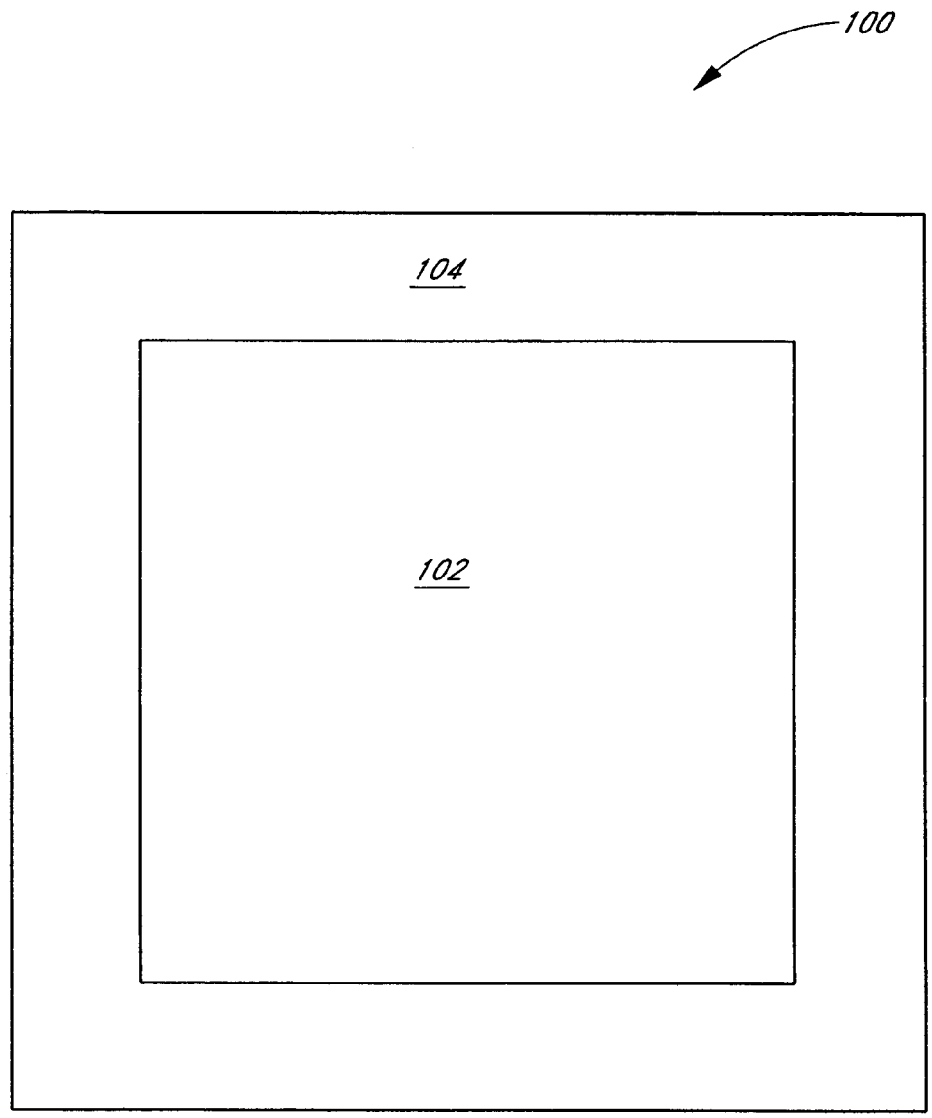
FIGS. 3A-3B are schematic, top plan and cross-sectional side views, respectively, of a partially formed memory device, in accordance with preferred embodiments of the invention.

FIG. 3A shows a top view of an integrated circuit 100, which is preferably a memory chip. A central region 102, the "array," is surrounded by a peripheral region 104, the "periphery." It will be appreciated that, in a fully formed integrated circuit 100, the array 102 will typically be densely populated with conducting lines and electrical devices such as transistors and capacitors. In a memory device, the electrical devices form a plurality of memory cells, which are typically arranged in a regular pattern, such as rows. Desirably, pitch multiplication can be used to form features such as rows/columns of transistors, capacitors or interconnects in the array 102, as discussed below. On the other hand, the periphery 104 typically comprises features larger than those in the array 102. Conventional photolithography, rather than pitch multiplication, is typically used to pattern features in the periphery 104, because the geometric complexity of logic circuits located in the periphery 104 makes using pitch multiplication difficult, whereas the regular grid typical of memory array patterns is conducive to pitch multiplication. In addition, some devices in the periphery require larger geometries due to electrical constraints, thereby making pitch multiplication less advantageous than conventional photolithography for such devices.

Figure 3B:
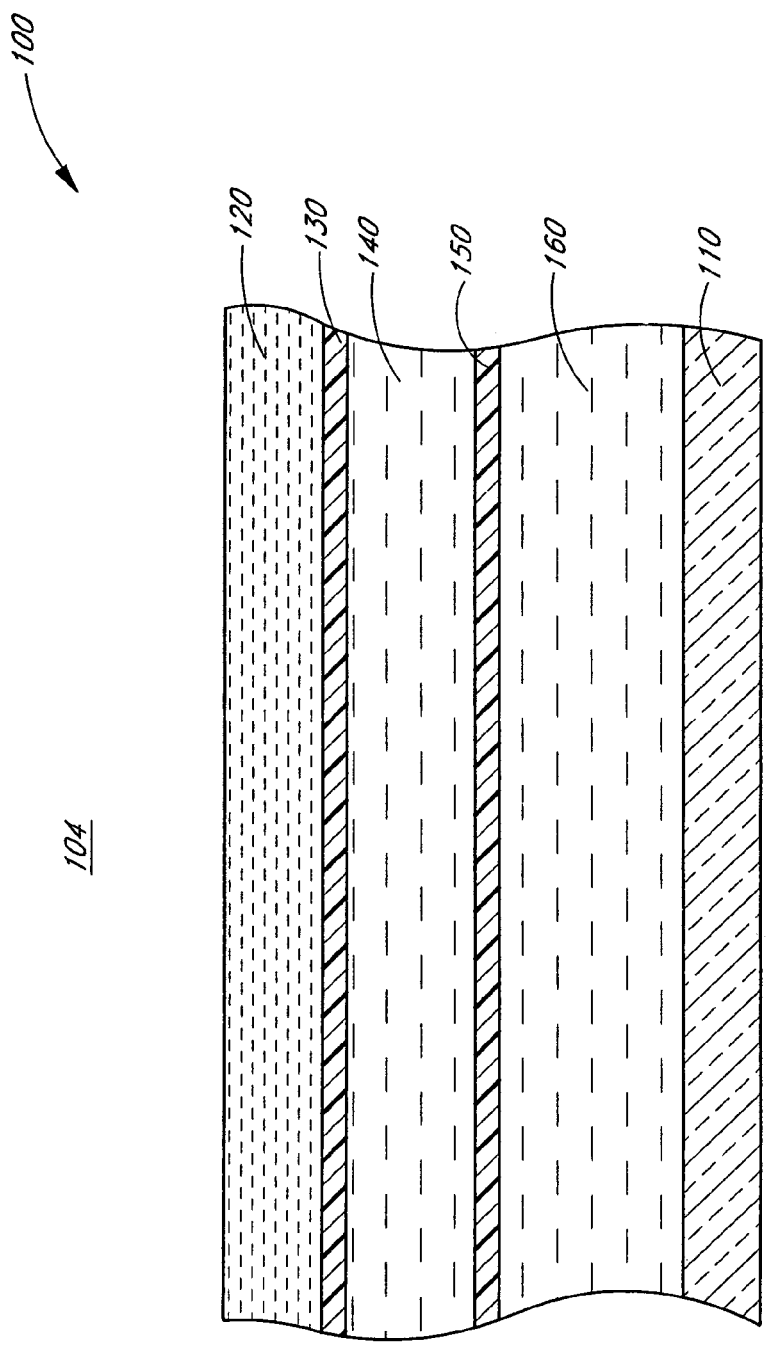

With reference to FIG. 3B, a partially formed integrated circuit 100 is provided. A substrate 110 is provided below various layers 120-160. The substrate 110 will be patterned to form various features and the layers 120-160 will be etched to form a mask for this patterning, as discussed below. The materials for the layers overlying the substrate 110 are preferably chosen based upon consideration of the chemistry and process condition requirements for the various pattern forming and pattern transferring steps discussed herein. Because the layers between a topmost photodefinable layer 120 and the substrate 110 function to transfer a pattern derived from the photodefinable layer 120 to the substrate 110, the layers between the photodefinable layer 120 and the substrate 110 are preferably chosen so that they can be selectively etched relative to other exposed materials. It will be appreciated that a material is considered selectively, or preferentially, etched when the etch rate for that material is at least about 5 times greater, preferably at least about 10 times greater, more preferably at least about 20 times greater and, most preferably, at least about 40 times greater than that for surrounding materials.

In the illustrated embodiment, the photodefinable layer 120 overlies a first hard mask, or etch stop, layer 130, which overlies a temporary layer 140, which overlies a second hard mask, or etch stop, layer 150, which overlies an additional hard mask layer 160, which overlies the substrate 110 to be processed (e.g., etched) through a mask. Preferably, the mask through which the substrate 110 is processed is formed in the additional hard mask layer 160.

It will be understood that in common methods of transferring patterns, both the mask and the underlying substrate are exposed to an etchant, which preferentially etches away the substrate material. The etchants, however, also wear away the mask materials, albeit at a slower rate. Thus, over the course of transferring a pattern, the mask can be worn away by the etchant before the pattern transfer is complete. These difficulties are exacerbated where the substrate 110 comprises multiple layers to be etched. In such cases, the additional hard mask layer 160 is desirable to prevent the mask pattern from being worn away before the pattern transfer complete. The illustrated embodiment shows the use of the additional hard mask layer 160.

It will be understood, however, that because the various layers are chosen based upon the requirements of chemistry and process conditions, one or more of the layers can be omitted in some embodiments. For example, the additional hard mask layer 160 can be omitted in embodiments where the substrate 110 is relatively simple, e.g., where the substrate 110 is a single layer of material and where the depth of the etch is moderate. In such cases, the second hard mask layer 150 may be a sufficient mask for transferring a pattern to the substrate 110. Similarly, for a particularly simple substrate 110, the various other layers, such the second hard mask layer 150 itself, may be omitted and overlying mask layers may be sufficient for the desired pattern transfer. The illustrated sequence of layers, however, is particularly advantageous for transferring patterns to difficult to etch substrates, such as a substrate 110 comprising multiple materials or multiple layers of materials, or for forming small features.

In addition to selecting appropriate materials for the various layers, the thicknesses of the layers 120-160 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the overlying layer is preferably thick enough so that it is not worn away over the course of the etch of the underlying layer. The selected thickness, of course, depends in part on the level of selectivity of the etch chemistry.

In the illustrated embodiment, the photodefinable layer 120 is preferably between about 100 nm and 500 nm thick and, more preferably, about 200 nm thick. The first hard mask layer 130 is preferably between about 10 nm and 50 nm thick and, more preferably, about 25 nm thick. The temporary layer 140 is preferably between about 50 nm and 200 nm thick and, more preferably, about 100 nm thick. The second hard mask or etch stop layer 150 is preferably between about 20 nm and 70 nm thick and, more preferably, about 50 nm thick and the additional hard mask layer 160 is preferably between about 150 nm and 500 nm thick and, more preferably, about 200-300 nm thick.

With continued reference to FIG. 3B, the photodefinable layer 120 is preferably formed of a photoresist, including any photoresist known in the art. For example, the photoresist can be any photoresist compatible with 157 nm, 193 nm or 248 nm wavelength sytems, 193 nm wavelength immersion systems or electron beam systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems.

The material for the first hard mask layer 130 is preferably inorganic; exemplary materials include silicon oxide ($SiO_2$), silicon or a dielectric anti-reflective coating (DARC), such as a silicon-rich silicon oxynitride. DARCs can be particularly advantageous for forming patterns having pitches near the resolution limits of a photolithographic technique because they can enhance resolution by minimizing light reflections. It will be appreciated that unwanted light reflections can decrease the precision with which photolithography can define the edges of a pattern. Optionally, an anti-reflective coating (ARC), e.g., a bottom anti-reflective coating (BARC) (not shown) can similarly be used in addition to, or in place of, the inorganic first hard mask layer 130 to control light reflections.

The temporary layer 140 is preferably formed of amorphous carbon, which offers very high etch selectivity relative to the preferred hard mask materials. More preferably, the amorphous carbon is a form of amorphous carbon that is highly transparent to light and which offers further improvements for mask alignment.

As with the first hard mask layer 130, the second hard mask layer 150 is preferably an inorganic material, with examples including a dielectric anti-reflective coating (DARC) (e.g., a silicon oxynitride), a silicon oxide ($SiO_2$) or silicon. In addition, a bottom anti-reflective coating (BARC) (not shown) can also optionally be used to control light reflections. While the first and the second hard mask layers 130 and 150 can be formed of different materials, these layers are preferably formed of the same material for ease of processing and to minimize the number of different deposition tools and etch chemistries utilized, as described below. Like the temporary layer 140, the additional hard mask layer 160 is preferably formed of amorphous carbon.

It will be appreciated that the various layers discussed herein can be formed by various methods known to those of skill in the art. For example, various vapor deposition processes, such as chemical vapor deposition, can be used to form the hard mask layers. Spin-on-coating processes can be used to form the photodefinable layers. In addition, amorphous carbon layers can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Pat. No. 6,573,030 B1, issued to Fairbairn et al. on Jun. 3, 2003, the entire disclosure of which is incorporated herein by reference.

In a first phase of the method in accordance with the preferred embodiments and with reference to FIGS. 4-10, pitch multiplication in the array region of the partially formed integrated circuit 100 is performed.

Figure 4B:
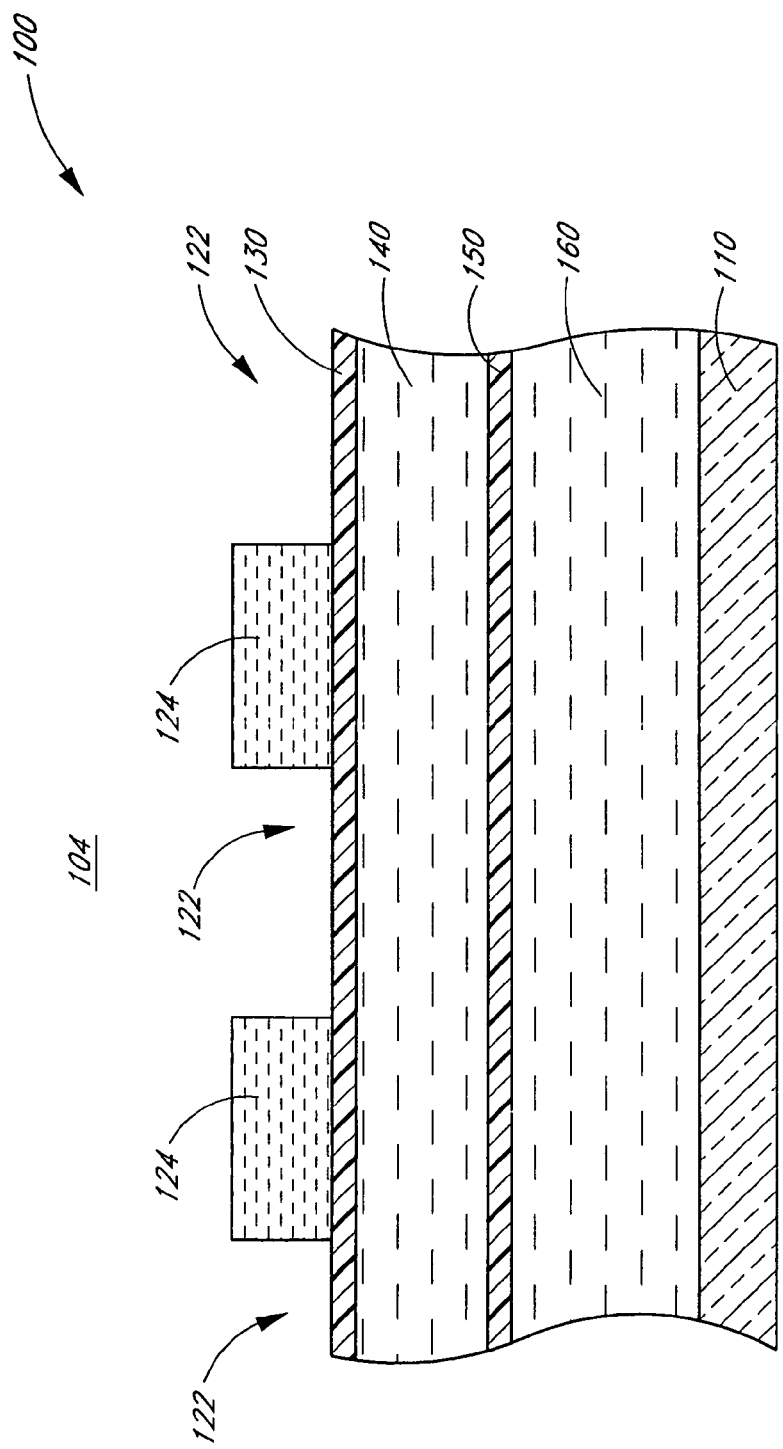

With reference to FIGS. 4A and 4B, a pattern comprising spaces or trenches 122 defined by photodefinable material 124 is formed in the photodefinable layer 120. FIG. 4A shows a schematic top view of a part of the pattern in the partially formed memory device 100 and FIG. 4B shows a schematic side view, as viewed through the vertical plane 4B of FIG. 4A. The photodefinable layer 120 can be patterned by, e.g., photolithography, in which the layer 120 is exposed to radiation through a reticle and then developed. After being developed, the remaining photodefinable material, photoresist in the illustrated embodiment, comprises lines 124, which define spaces 122.

With continued reference to FIG. 4A, while they can be any size, the widths $F_{A1}$ and $F_{A2}$ of the photoresist lines 124 and the spaces 122 in the array 102 are preferably both approximately equal, for simplicity of processing and to allow a high density of lines in the array. In addition, the widths $F_{A1}$ and $F_{A2}$ are preferably at or near the limits of the photolithographic technique used to pattern the photodefinable layer 120. Thus, the sum of $F_{A1}$ and $F_{A2}$ may be at the minimum pitch of the photolithographic technique.

Also, while they can be any size, to simplify processing, the widths $F_{P1}$ and $F_{P2}$ in the periphery 104 are preferably also preferably both approximately equal. $F_{P1}$ and $F_{P2}$, however, are preferably about 1.5 time greater and, more preferably about 1.5 to about 3 times greater than each of $F_{A1}$ and $F_{A2}$, to allow for an increased margin of error in aligning mask patterns derived from the photoresist lines 124 and the spaces 122 with other features. It will be appreciated that the actual widths of $F_{P1}$ and $F_{P2}$ can be varied, depending upon the resolution and overlay accuracy of the methods later used to define the features that will contact the lines 124.

Preferably, part of the lines 124 in the periphery 104 are formed at an angle 126 relative to portions of the lines 124 located in the array 102. Preferably, the angle 126 is less than about 90°, preferably greater than about 30°, more preferably between about 30-90° and is about 90° in the illustrated embodiment. In addition, the angle 126 is most preferably the same and bends in the same direction for all lines 124.

Figure 5:
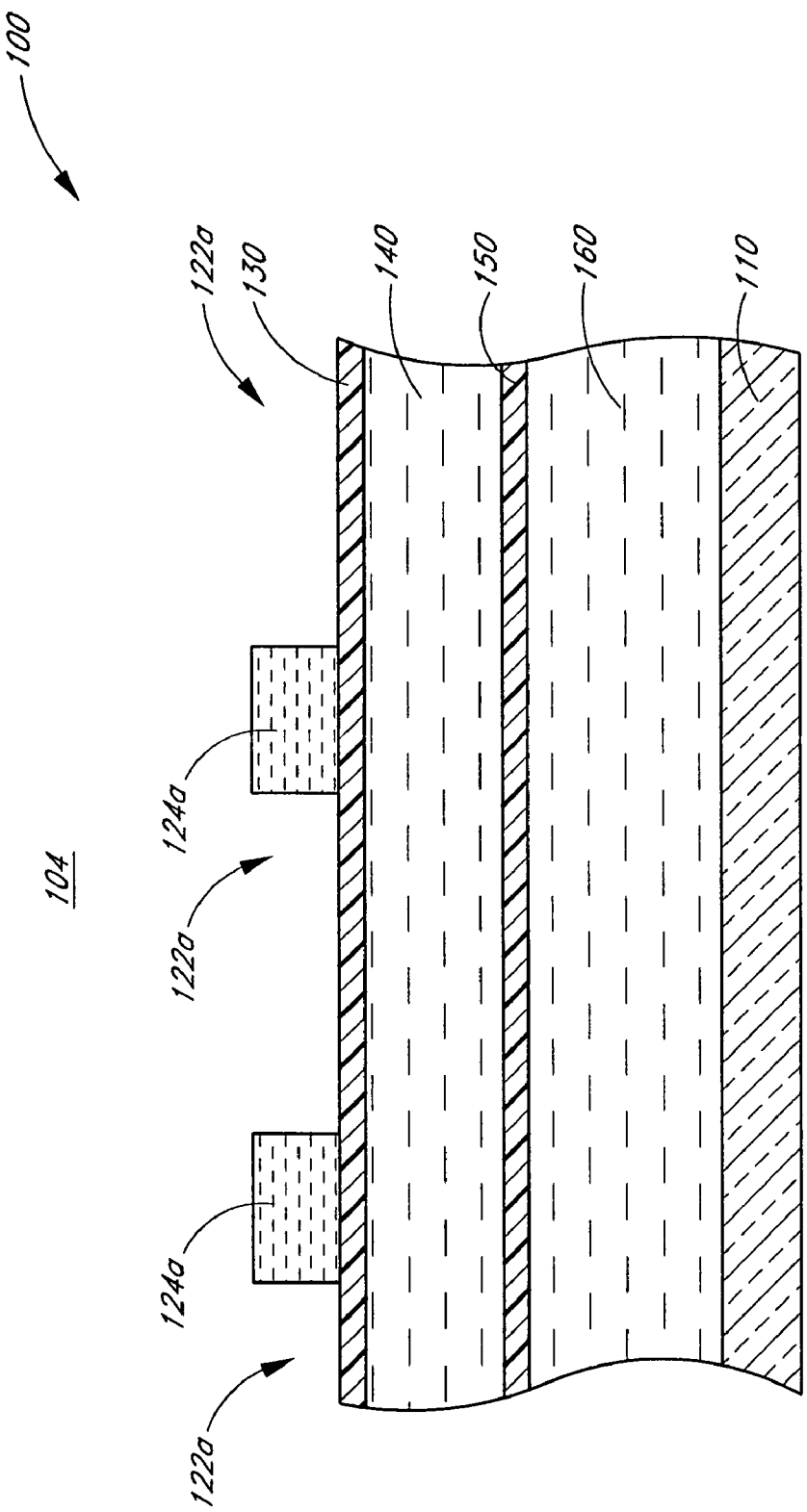
FIG. 5 is a schematic, cross-sectional side view of the partially formed memory device of FIGS. 4A-4B after widening spaces between photoresist lines, in accordance with preferred embodiments of the invention.

As shown in FIG. 5, the lines 124 can optionally be narrowed by etching, to form spaces 122a and 124a. The photoresist lines 124 are preferably etched using an isotropic etch, such as a sulfur oxide plasma, e.g., a plasma comprising $SO_2$, $O_2$, $N_2$ and Ar. The extent of the etch is preferably selected so that the width of the spaces 122a and the lines 124a correspond to the desired spacing of the spacers to be formed, as will be appreciated from the discussion below with respect to FIGS. 8-10. Advantageously, because lines 124a are typically narrower in the array 102 (FIG. 3A), this etch allows the formation of lines 124a in the array 102 that are narrower than would be possible using the photolithographic technique originally used to pattern the photodefinable layer 120. In addition, the etch can smooth the edges of the lines 124a, thereby improving the uniformity of those lines 124a. In other embodiments, this narrowing of the lines 124 can be performed after transferring the pattern in the photodefinable layer 120 to the first hard mask layer 130 and/or the temporary layer 140.

The pattern of the (modified) photodefinable layer 120 is preferably transferred to a layer 140 of material that can withstand the process conditions for spacer material deposition and etch, discussed below. In other embodiments, where the deposition and etch of spacer material is compatible with the photodefinable layer 120, the spacer material can be deposited directly on the photodefinable layer 120.

In the illustrated embodiment, in addition to having higher heat resistance than photoresist, the material forming the temporary layer 140 is preferably selected such that it can be selectively removed relative to the material for the spacers 175 (FIG. 10) and the underlying layer 150. As noted above, the layer 140 is preferably formed of amorphous carbon. Because the preferred chemistries for etching photoresist also typically etch significant amounts of amorphous carbon and because chemistries are available for etching amorphous carbon with excellent selectivity relative to a variety of materials, a hard mask layer 130, selected from such materials, preferably separates the layers 120 and 140. As noted above, suitable materials for the hard mask layer 130 include inorganic materials, such as DARCs, silicon oxides or nitrides, and silicon.

Figure 6:
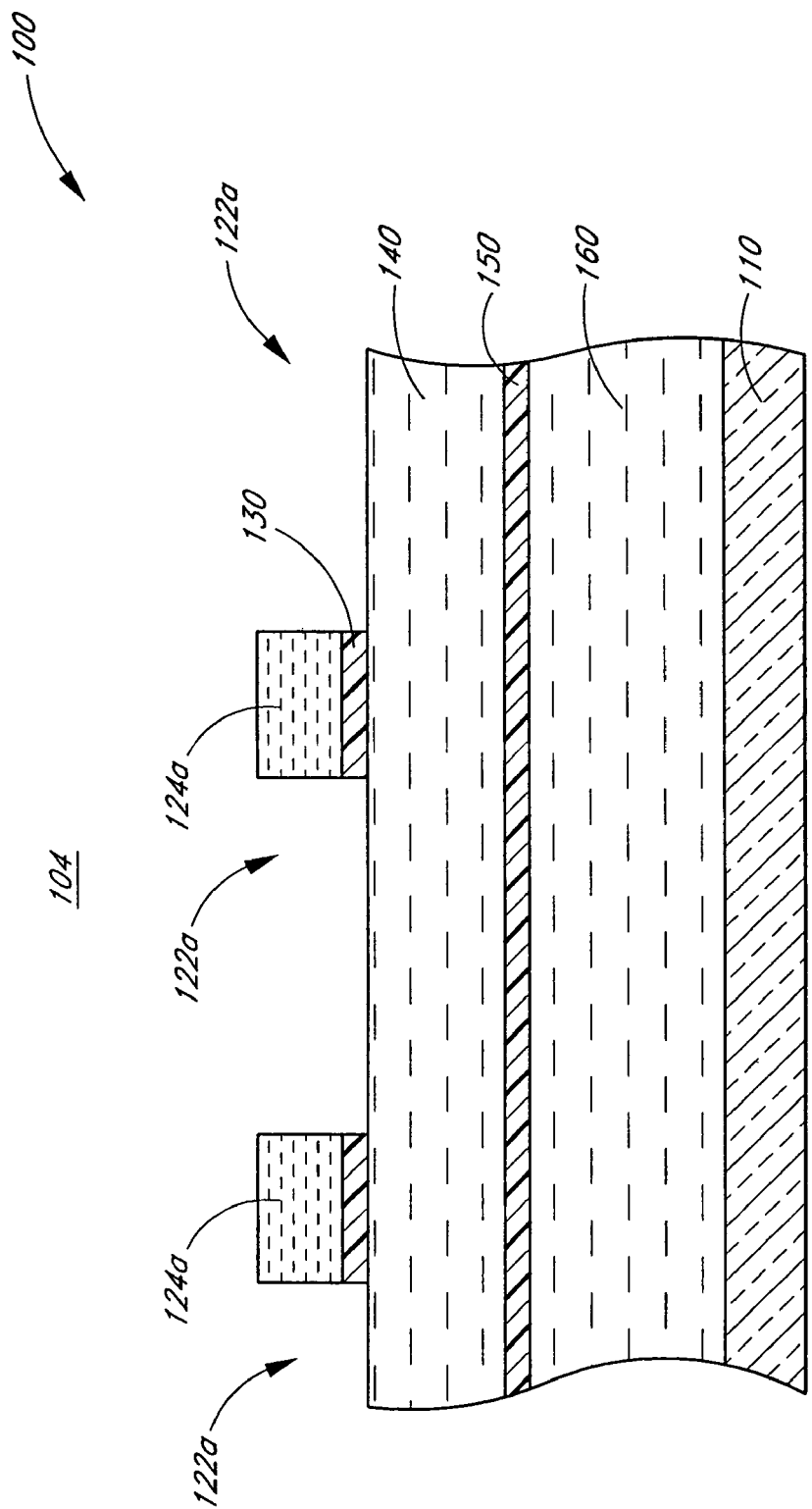
FIG. 6 is a schematic, cross-sectional side view of the partially formed memory device of FIG. 5 after etching through a hard mask layer, in accordance with preferred embodiments of the invention.

The pattern in the photodefinable layer 120 is preferably transferred to the hard mask layer 130, as shown in FIG. 6. This transfer is preferably accomplished using an anisotropic etch, such as an etch using a fluorocarbon plasma, although a wet (isotropic) etch may also be suitable if the hard mask layer 130 is suitably thin. Preferred fluorocarbon plasma etch chemistries include $CFH_3$ $CF_2H_2$ and $CF_3H$.

Figure 7:
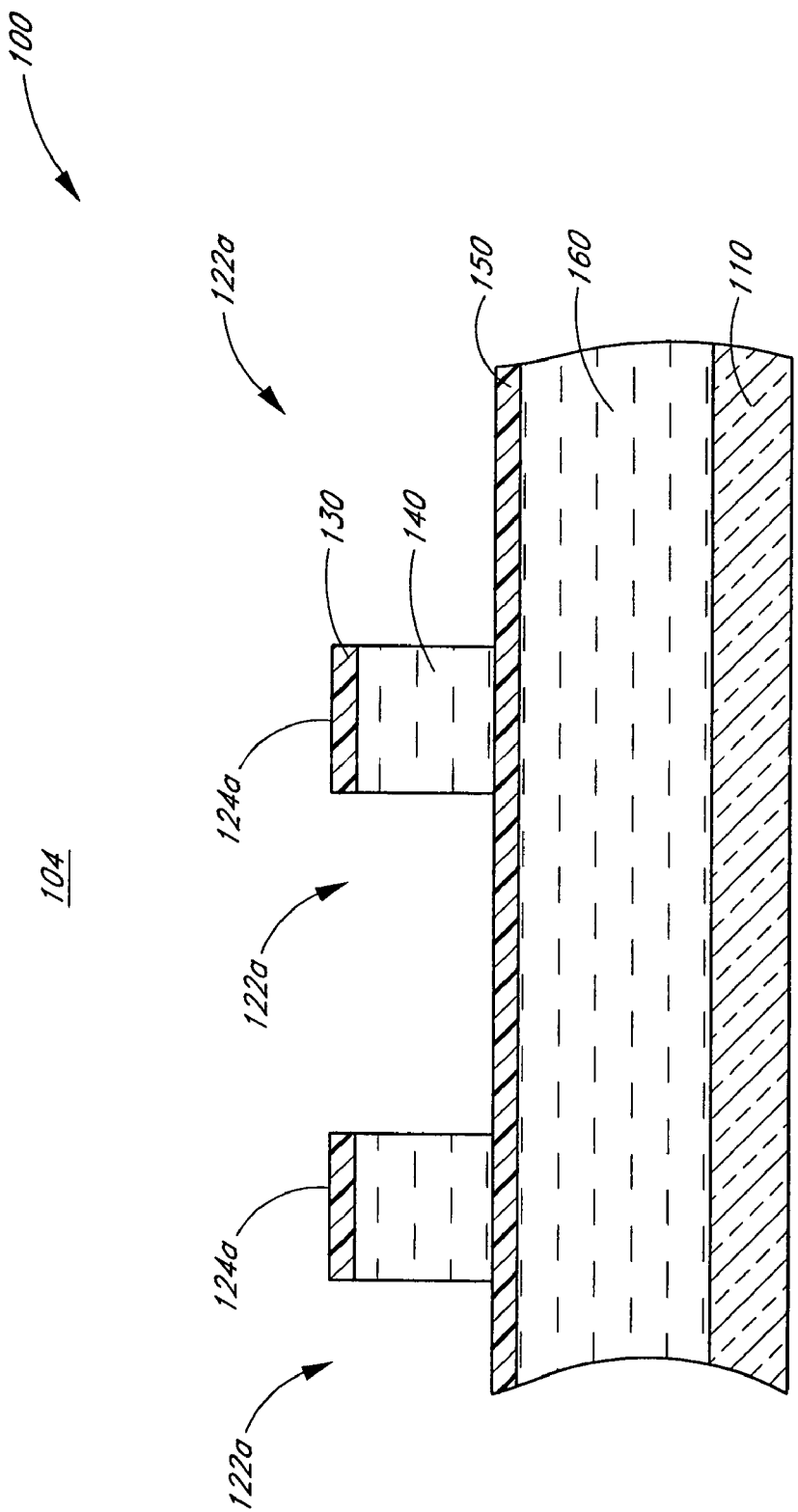
FIG. 7 is a schematic, cross-sectional side view of the partially formed memory device of FIG. 6 after transferring a pattern from the photoresist layer to a temporary layer, in accordance with preferred embodiments of the invention.

The pattern is then transferred to the temporary layer 140, as shown in FIG. 7, preferably using a sulfur-containing plasma, e.g., a plasma containing $SO_2$, $O_2$ and Ar. Advantageously, the sulfur-containing plasma can etch carbon of the preferred temporary layer 140 at a rate greater than about 20 times and, more preferably, greater than about 40 times the rate that the hard mask layer 130 is etched. A suitable sulfur-containing plasma is described in U.S. patent application Ser. No. 10/931,772 to Abatchev et al., filed Aug. 31, 2004, entitled Critical Dimension Control, the entire disclosure of which is incorporate herein by reference. It will be appreciated that the sulfur-containing plasma can simultaneously etch the temporary layer 140 and also remove the photodefinable layer 120. The resulting lines 124a constitute the placeholders or mandrels upon which a pattern of spacers 175 (FIG. 10) will be formed.

Figure 8:
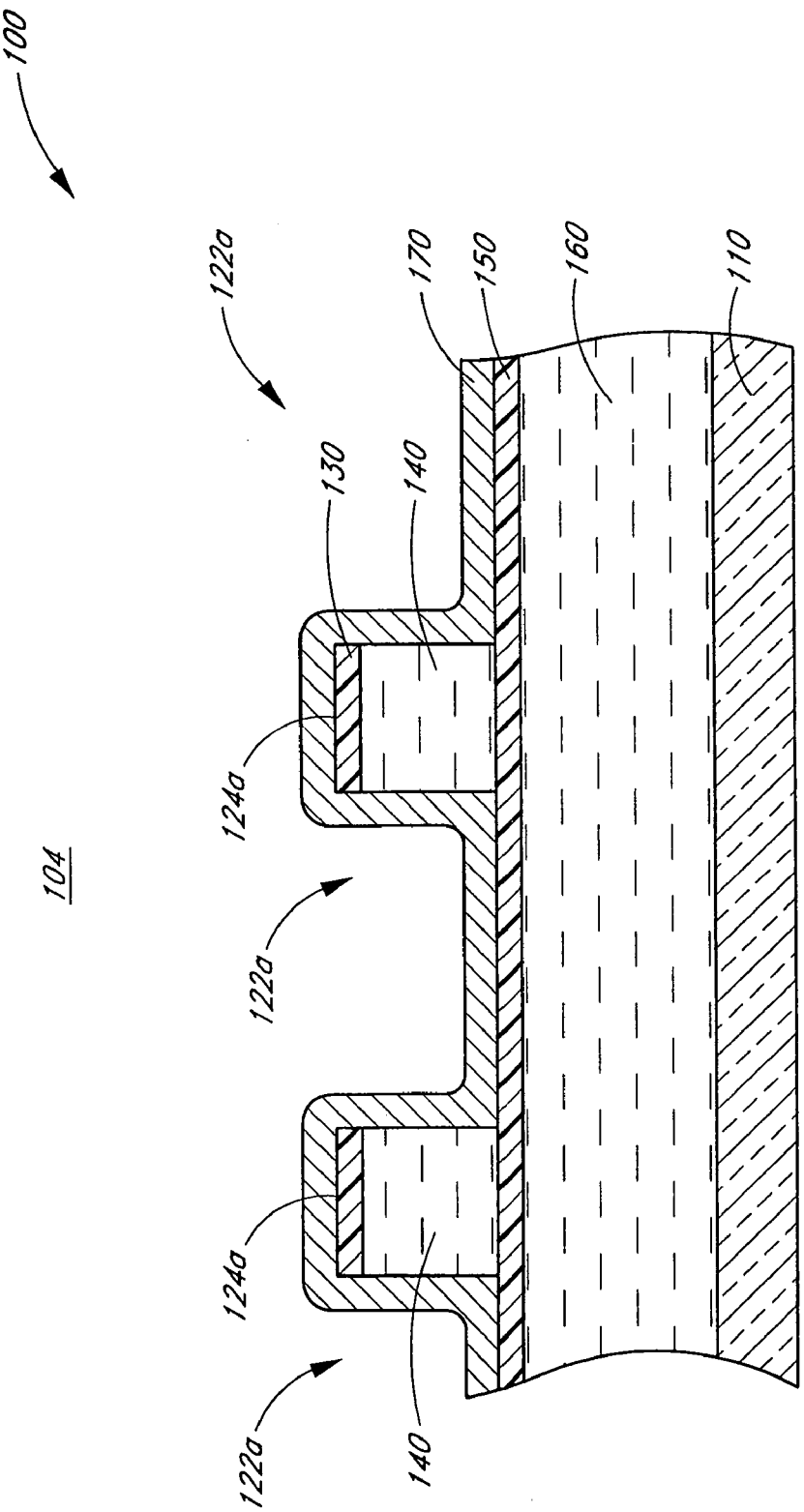
FIG. 8 is a schematic, cross-sectional side view of the partially formed memory device of FIG. 7 after depositing a layer of a spacer material, in accordance with preferred embodiments of the invention.

As shown in FIG. 8, a layer 170 of spacer material is preferably next deposited conformally over the hard mask layer 130. The spacer material can be any material capable of use as a mask to transfer a pattern to the underlying additional hard mask layer 160. The spacer material preferably: 1) can be deposited with good step coverage, 2) can be deposited at a low temperature compatible with the temporary layer 140; 3) can be selectively etched relative to the directly underlying layer, e.g., the hardmask layer 150; and 4) allows the temporary layer 140 and the underlying second hardmask layer 150 to be etched without itself being worn away. Preferred materials include silicon nitrides and silicon oxides.

Figure 9:
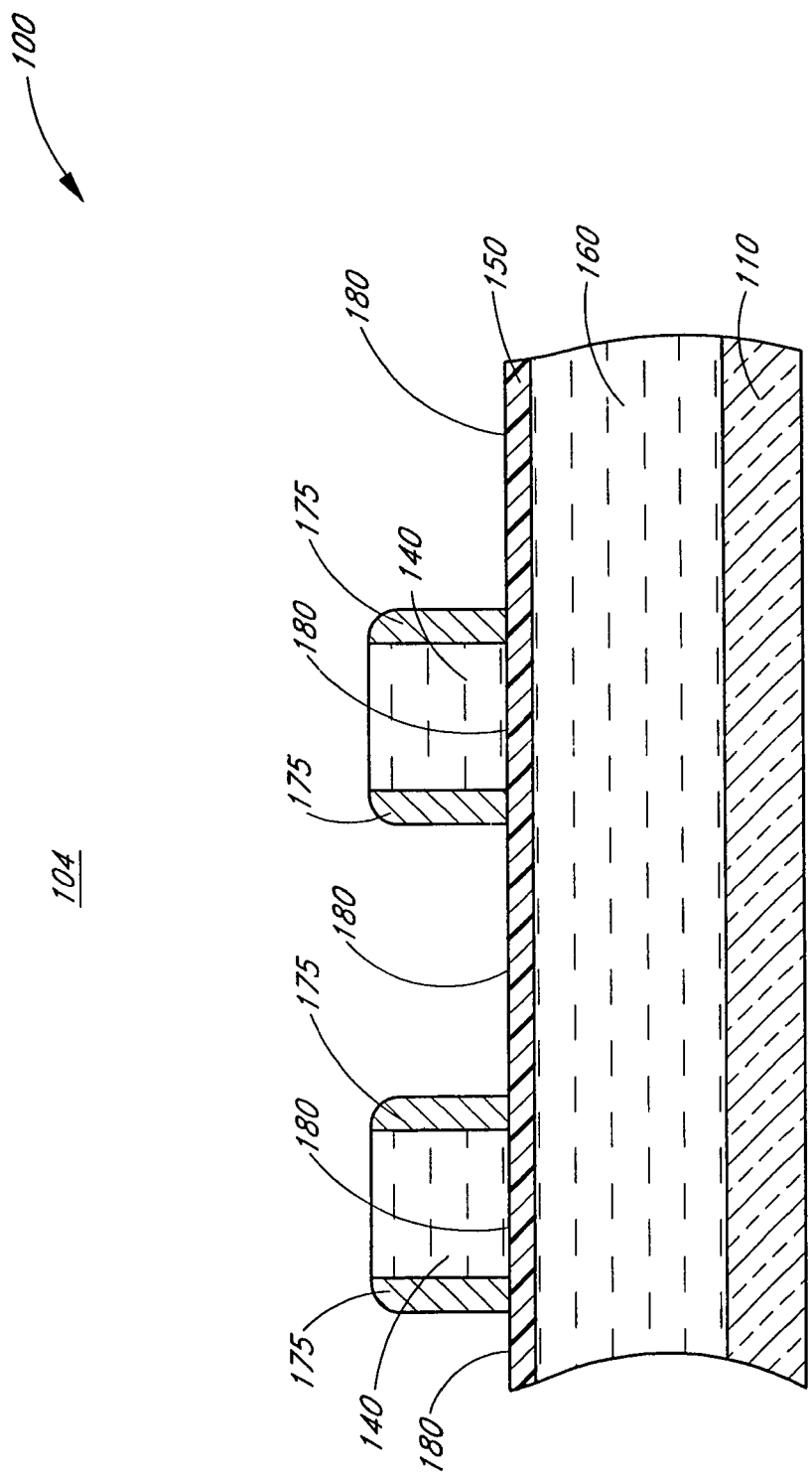
FIG. 9 is a schematic, cross-sectional side view of the partially formed memory device of FIG. 8 after a spacer etch, in accordance with preferred embodiments of the invention.

As shown in FIG. 9, the spacer layer 170 is then subjected to an anisotropic etch to remove spacer material from horizontal surfaces 180 of the partially formed integrated circuit 100. Such an etch, also known as a spacer etch, can be performed using a fluorocarbon plasma, which can also advantageously etch the hard mask layer 130.

Figure 10B:
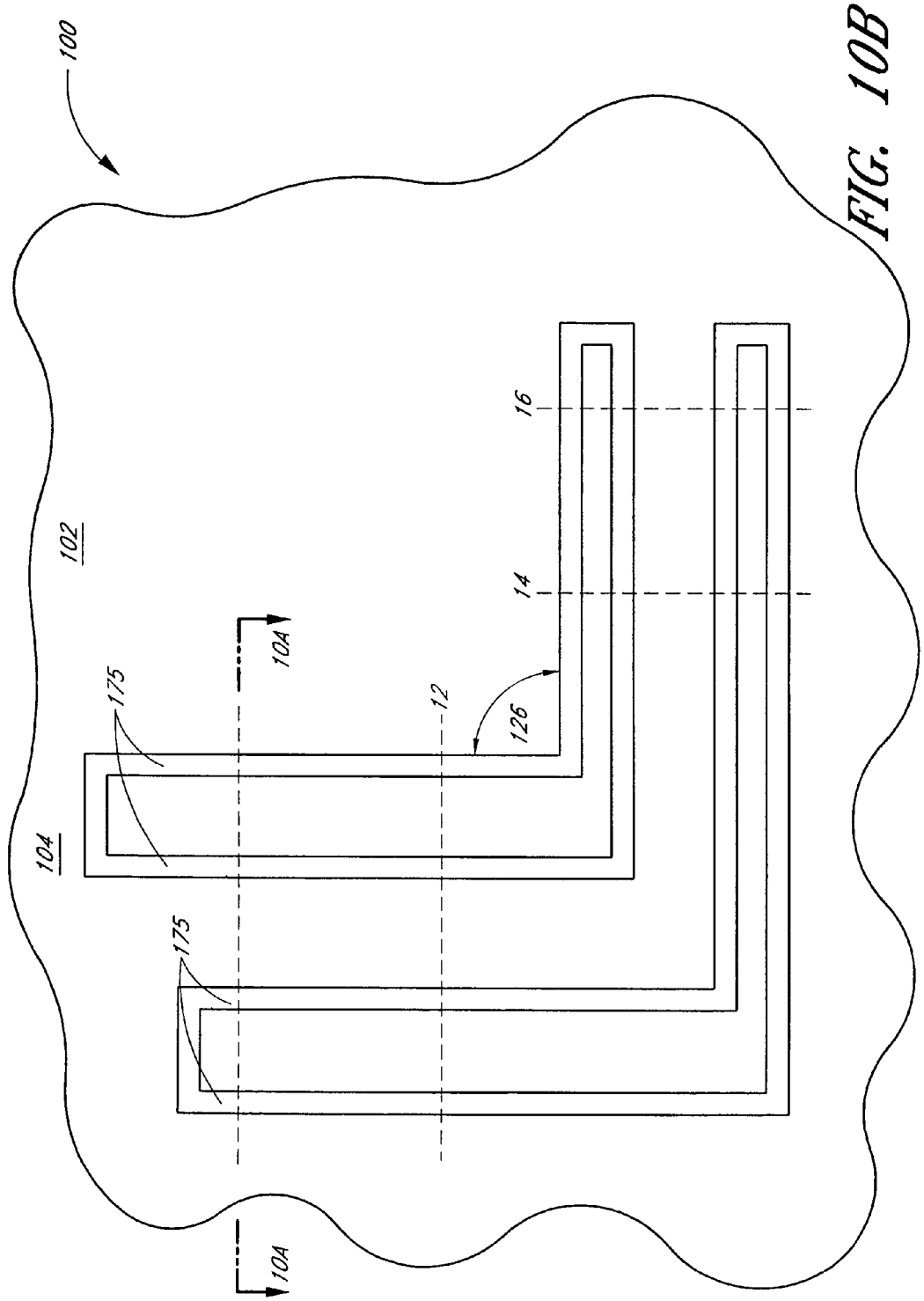
FIG. 10B is a schematic, top plan view of the partially formed memory device of FIG. 10A, in accordance with preferred embodiments of the invention.

Next, the amorphous carbon of the preferred temporary layer 140 can be selectively removed, using, e.g., a sulfur-containing plasma. FIGS. 10A, 10B and 10C show a pattern of spacers 175 left after the amorphous carbon etch. FIG. 10B schematically shows a top view of the spacers 175 and FIG. 10A shows a side view, taken along the vertical plane 10A.

FIG. 10C illustrates an embodiment in which the spacer lines 175 have an angled segment 177 to smooth the transition between the different angled portions of the spacers 175 for ease of optical proximity correction (OPC). It has been found that sharp corners can be difficult to form at the small dimensions typical of pitch multiplied lines. For example, the tips of these corners can be prone to breaking off, either at the level of the layers 120-160 or of the substrate 110. This breaking off on the level of the layers 120-160 can cause openings within a particular line, or shorts between neighboring lines to be patterned in the substrate 110, or pieces in the substrate 110 breaking off may themselves cause the shorts. Thus, to decrease the sharpness of the corners and to minimize this breaking off, the photodefinable layer 120 is preferably patterned to allow formation of transitional segments 177 at an intermediate angle between the angle 126 formed by the segments 178, between first and second planes 14 and 16, respectively, and the segments 179, between third and fourth planes, 10A and 12, respectively. For example, the transitional segments 177 can be formed at an angle of 45° in cases where the periphery segments 178 and the array segments 179 are at a 90° angle relative to teach other. It will be appreciated that more than one transitional segment 177 can be formed between the segments 178 and 179 to further ease the transition between the segments 178 and 179.

Thus, as shown in FIGS. 10A-10C, pitch multiplication in the array of the partially formed integrated circuit 100 has been accomplished and a pattern of spacers 175 has been formed based upon a pattern originally formed in the photodefinable layer 120. In the illustrated embodiment, the pitch of the spacers is half, and the density double, that of the photoresist lines 124 (FIG. 4) originally formed by photolithography. It will be appreciated that the spacers 175 generally follow the outline of the pattern or lines 124 formed in the photodefinable layer 120, thereby forming a closed loop.

Figure 11:
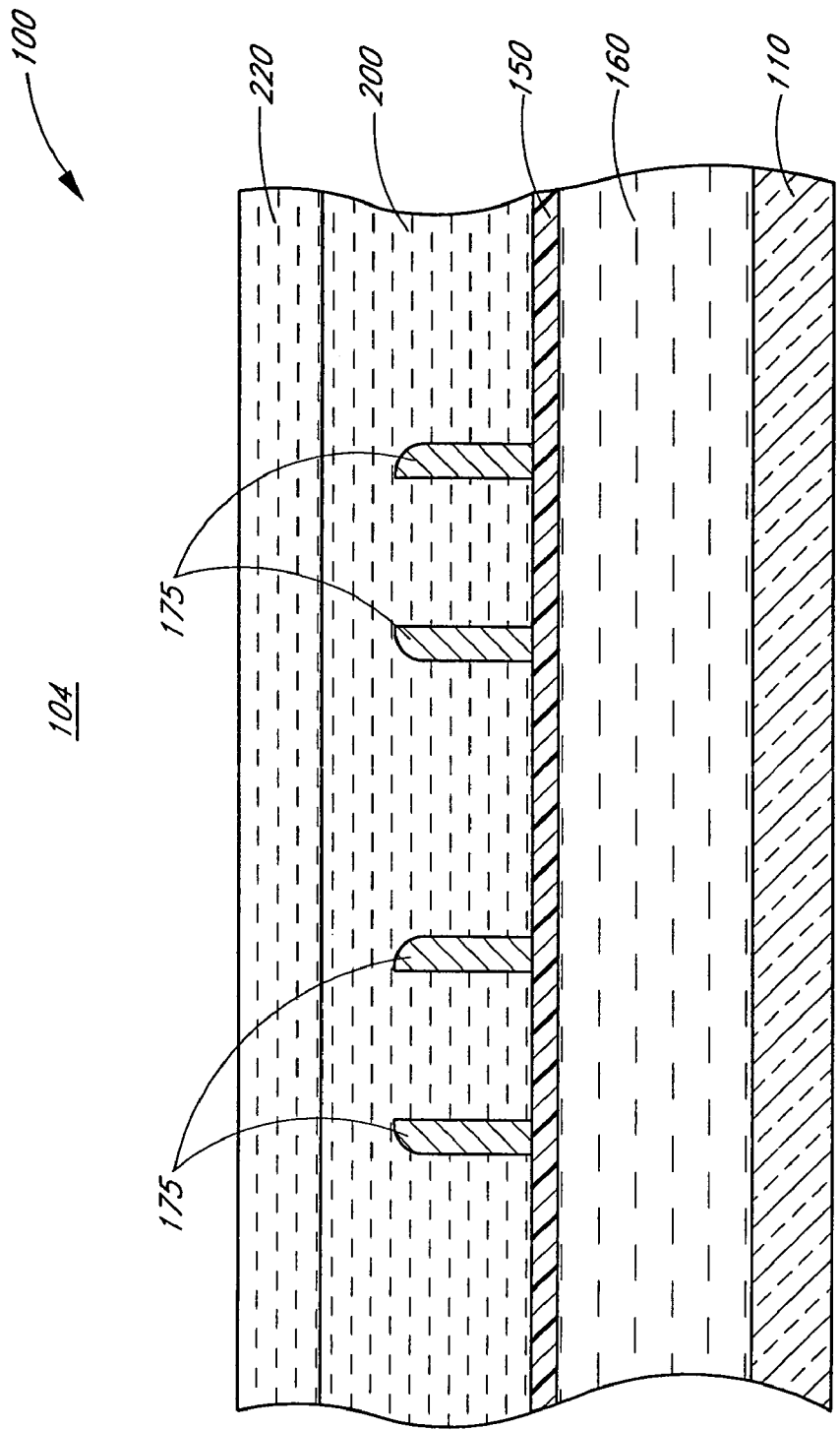
FIG. 11 is a schematic, cross-sectional side view of the partially formed memory device of FIGS. 10A-10C after surrounding the spacers with a removable material and forming a hard mask layer and a photodefinable layer over the spacers, in accordance with preferred embodiments of the invention.

Next, in a second phase of methods according to the preferred embodiments, a second pattern is stitched or overlapped with the pattern of spacers 175. In the illustrated embodiment, the second pattern is overlaid on the spacers 175 to pattern features that will contact the features defined by the spacers 175. To form this second pattern, the spacers 175 are preferably first protected by forming a planarizing protective layer 200 over and around the spacers 175, as shown in FIG. 11. In addition, another photodefinable layer 220 is preferably formed to allow the second pattern to be formed. The protective layer 200 is preferably at least as tall as the spacers 175 so that the photodefinable layer 220 can be formed completely overlying the spacers 175.

The protective layer 200 is preferably formed of a material that is readily removed selectively relative to the spacers 175. For example, the protective layer 200 can be formed of a photoresist, and may be the same or a different photoresist from that used to form the photodefinable layer 120 (FIGS. 3-6), which can be the same or a different material from than used to form the photodefinable layer 220. In other embodiments, the protective layer 200 is formed of amorphous carbon, which can be etched with excellent selectivity relative to the spacers 175. In the illustrated embodiments, the protective layer 200 is formed of an anti-reflective coating, preferably a spin-on organic BARC, and the photodefinable layer 220 is formed of a photoresist. Optionally, a hard mask or etch stop layer (not shown) can be formed between the layers 200 and 220.

A pattern corresponding to contacts to features to be defined by the spacers 175 is next formed in the photodefinable layer 220. It will be appreciated that the photodefinable layer 220 can be patterned using any photolithographic technique, including the same photolithographic technique used to pattern the photodefinable layer 120.

Figure 12:
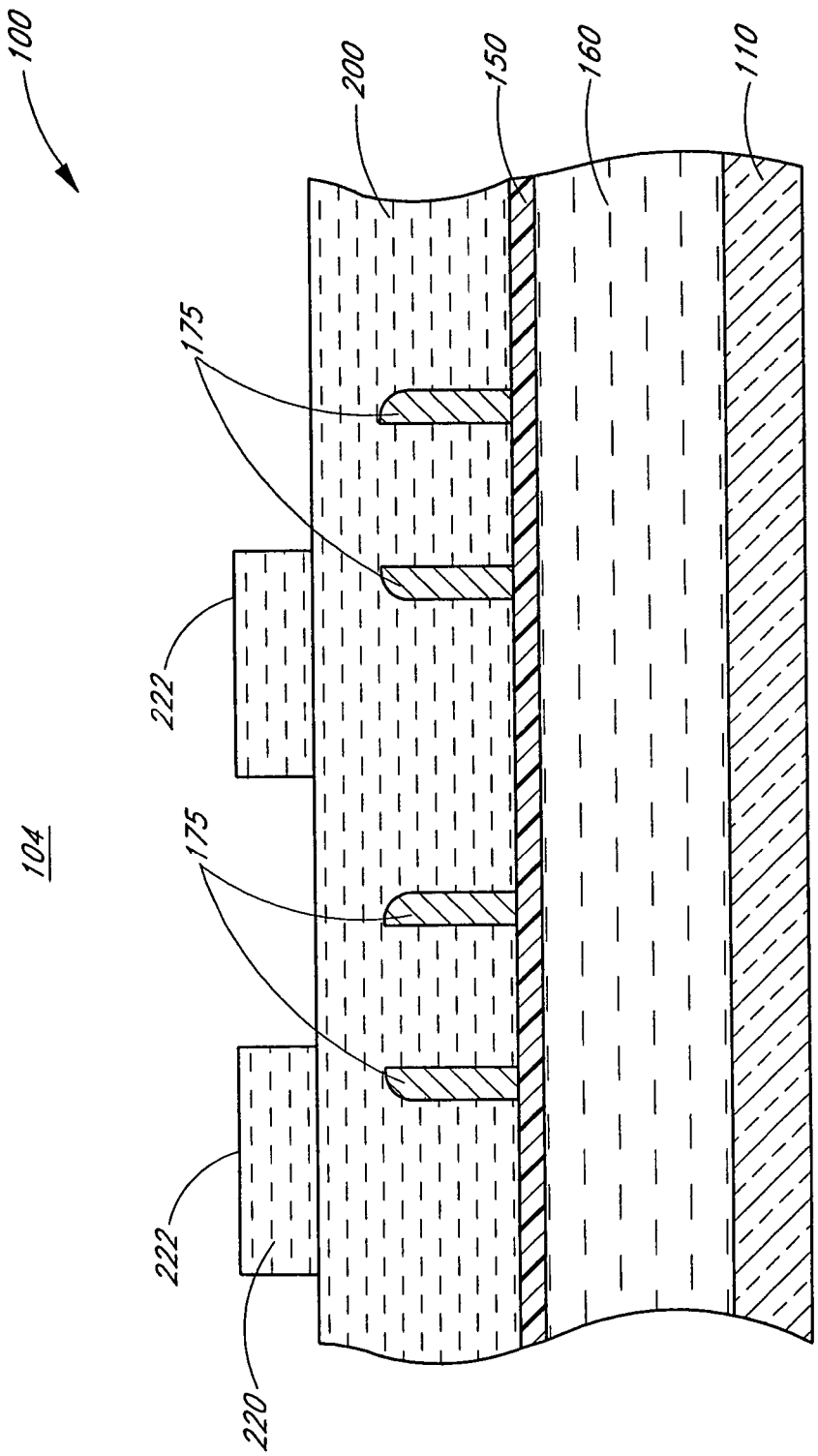
FIG. 12 is a schematic, cross-sectional side view of the partially formed memory device of FIG. 11 after forming a landing pad pattern in the photodefinable layer to overlay the spacer pattern, in accordance with preferred embodiments of the invention.

Thus, with reference to FIG. 12, a pattern of mask features 222 is formed in the photodefinable layer 220. It will be appreciated that the mask features 222 can be used to pattern features of different sizes than the spacers 175, including landing pads, local interconnects, periphery circuitry etc. As illustrated, the mask features 222 preferably overlap the pattern of spacers 175 to ultimately form landing pads using the mask features 222.

Figure 13:
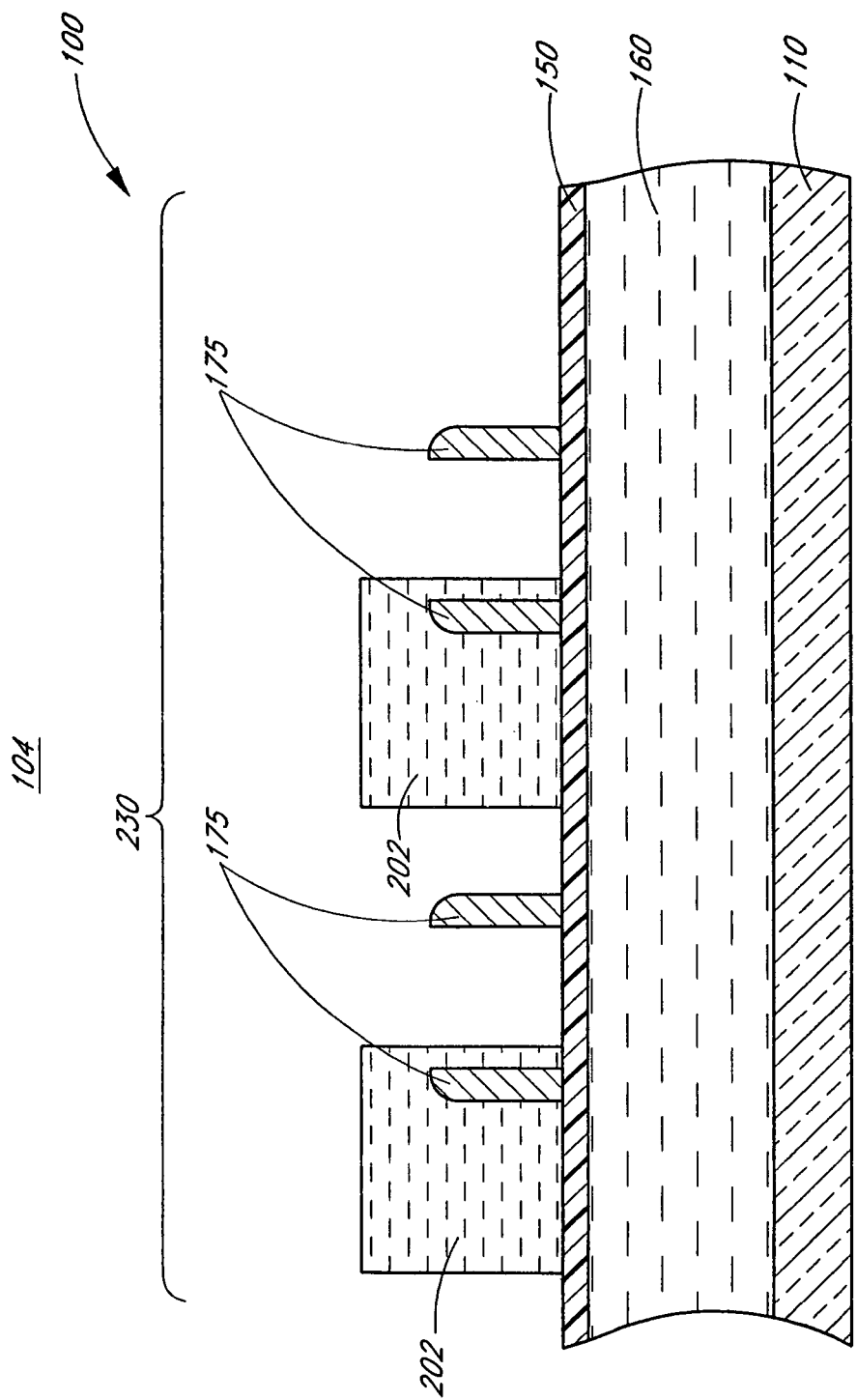
FIG. 13 is a schematic, cross-sectional side view of the partially formed memory device of FIG. 12 after transferring the landing pad pattern from the photodefinable layer to the same level as the spacers, in accordance with preferred embodiments of the invention.
Figure 14:
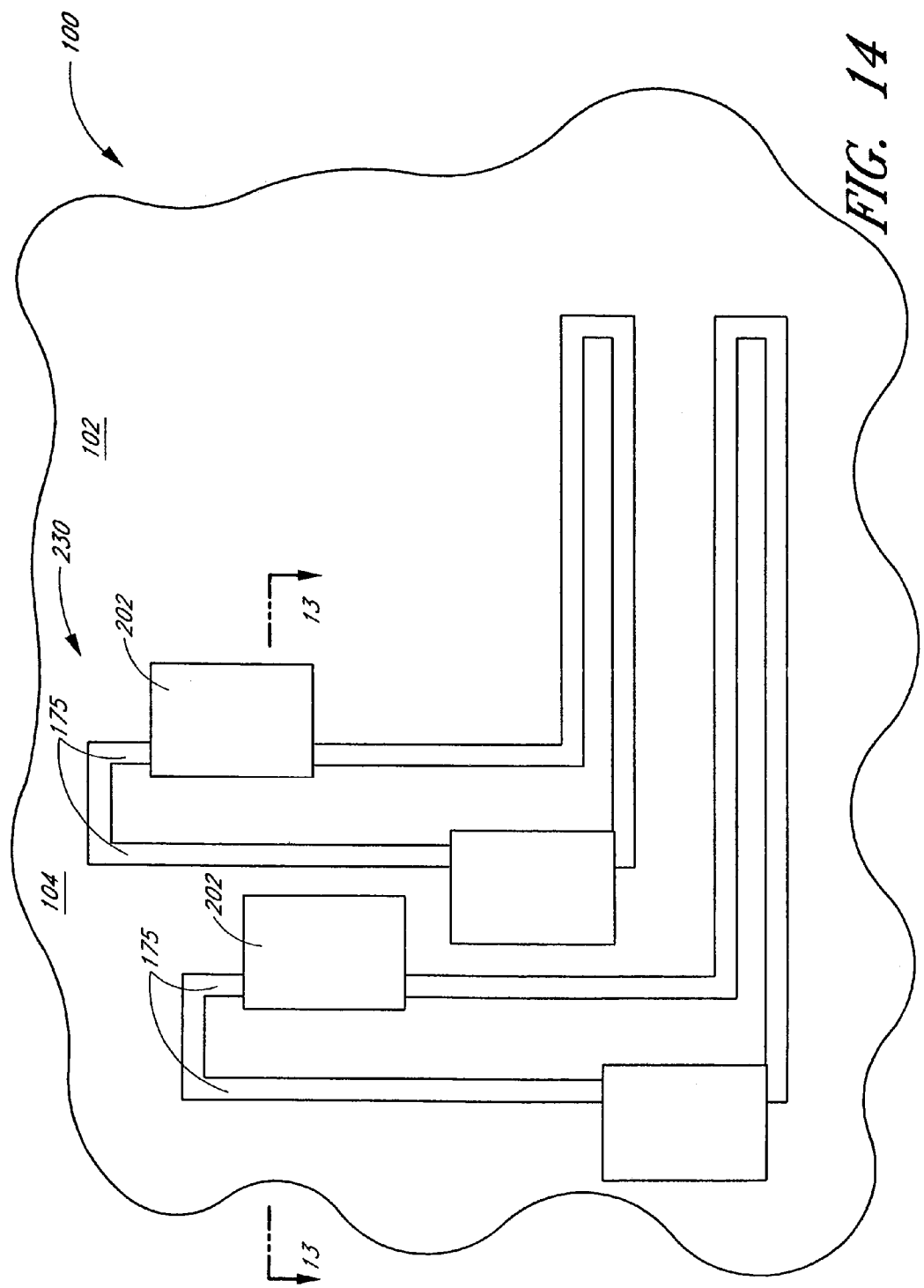
FIG. 14 is a schematic, top plan view of the partially formed memory device of FIG. 13, in accordance with preferred embodiments of the invention.

The pattern of features 222 is then transferred to the same level as the spacers 175. The protective layer 200 is preferably preferentially etched using an anisotropic etch, such as an etch with a sulfur-containing, preferably a $SO_2$-containing, plasma, as shown in FIG. 13. The spacers 175 and the feature 202, together forming a pattern 230, are left remaining after the protective layer etch. FIG. 14 shows a schematic top view of the resulting partially formed memory device 100. FIG. 13 shows a side view of the memory device 100, taken along the vertical plane 13 of FIG. 14.

With reference to FIG. 14, it will be appreciated that the distance separating individual features 202 is preferably determined by the resolution of the photolithographic technique used to define the features 202. Thus, the features 202 are preferably sized and located for reliable formation during integrated circuit fabrication. For example, the features 202 can have a minimum dimension of about 0.30 μm or less and the minimum distance between the features 202 and the spacers 175, e.g., preferably about 0.20 μm or less, or, more preferably, about 0.10 μm or less, can be smaller than the minimum separation between two features 202, e.g., preferably about 0.40 μm or less, or, more preferably, about 0.25 μm or less. This is because the separation between individual features 202 is determined by the native photolithographic resolution, while the separation between features 202 and spacers 175 is determined by the overlap capability of the photo tools, which typically allows higher tolerances than the native photolithography resolution. As a result, patterns can typically be overlaid each other with greater accuracy than individual features can be photolithographically defined in any individual mask layer. Thus, because of the different tolerances for placing the features 202 relative to teach other and relative to the spacers 175, the features 202 can be overlaid on and placed closer to the spacers 175 than they can be formed next to each other.

Figure 15:
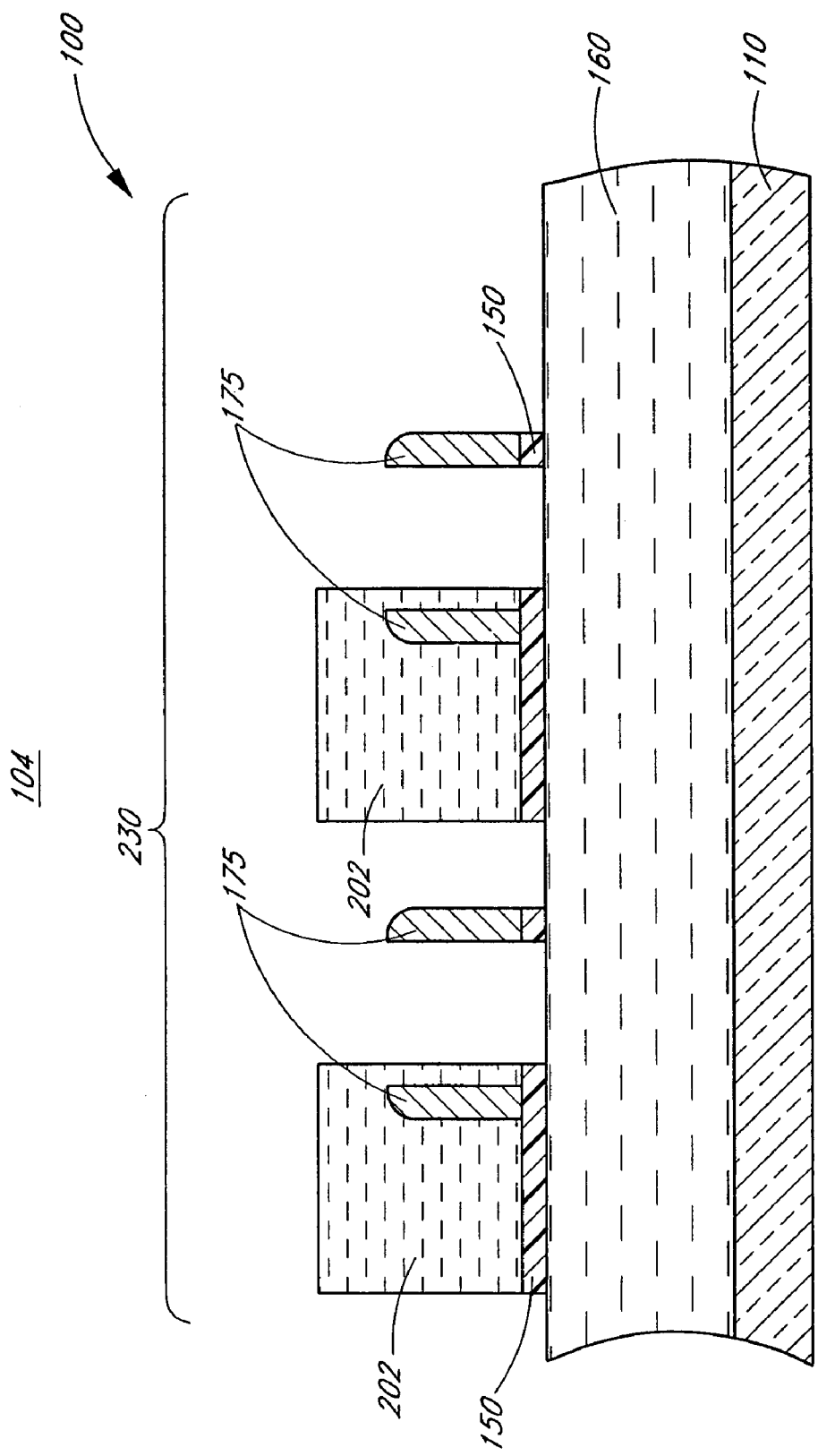
FIG. 15 is a schematic, cross-sectional side view of the partially formed memory device of FIGS. 13-14 after etching the landing pad pattern and the spacer pattern into an underlying hard mask layer, in accordance with preferred embodiments of the invention.
Figure 16B:
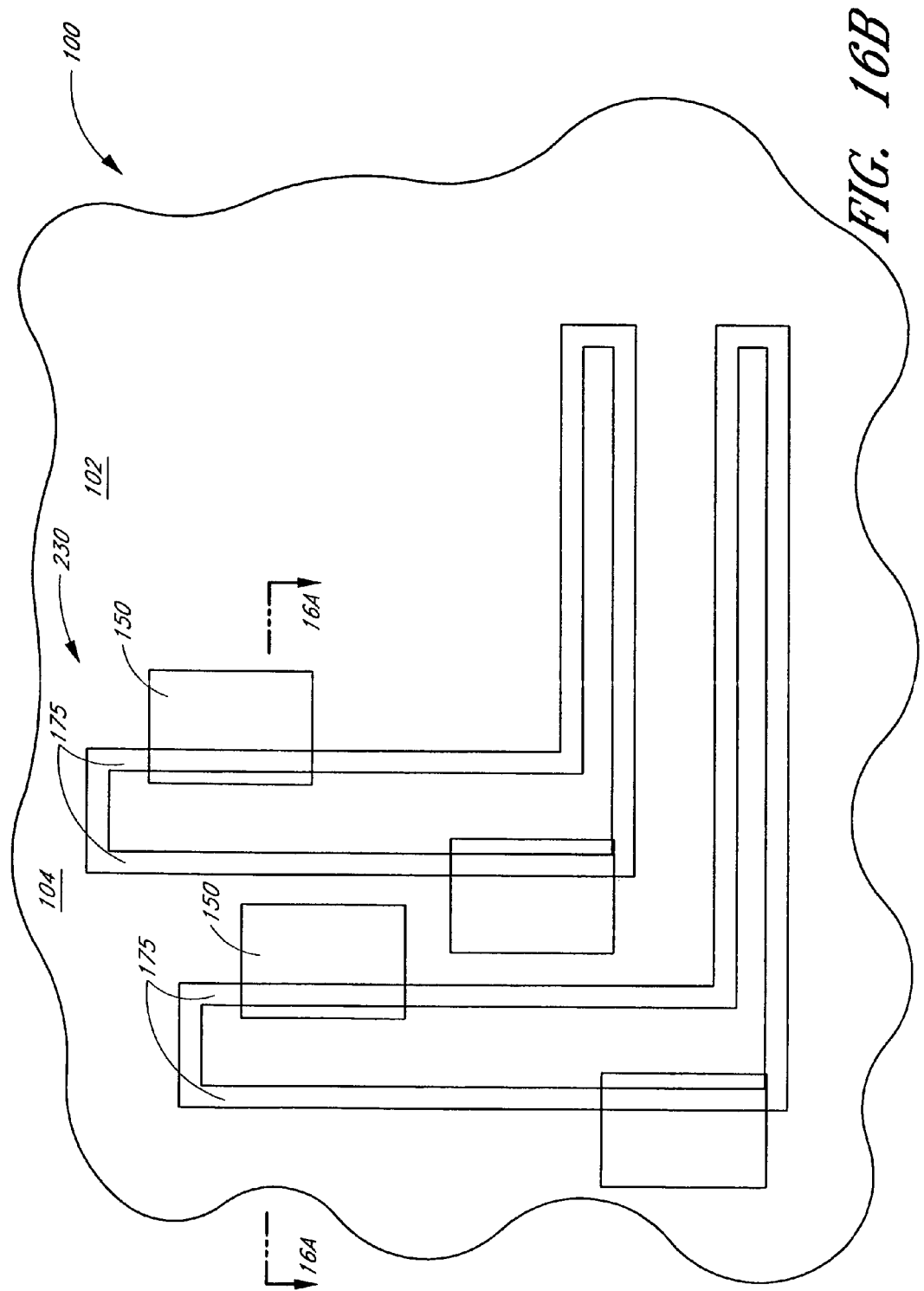

With reference to FIGS. 15 and 16, the pattern 230 is preferably transferred down to the additional hard mask layer 160. Preferably, the additional hard mask layer 160 comprises a material having good etch selectivity to the substrate 110, and vice versa, to allow for an effective transfer and later mask removal. To transfer to the pattern 230, the hard mask layer 150 overlying the additional hard mask layer 160 is first etched (FIG. 15). The hard mask layer 150 is preferably anisotropically etched, preferably using a fluorocarbon plasma. Alternatively, an isotropic etch may be used if the hard mask layer 150 is relatively thin. The additional hard mask layer 160 is then anisotropically etched, preferably using a $SO_2$-containing plasma, which can simultaneously remove the mask features 202 formed from the protective material 200. FIG. 16A shows a schematic side view of the resulting partially formed memory device 100. FIG. 16B shows a schematic top plan view of the partially formed memory device 100, with FIG. 16A being the side view taken along the vertical plane 16A.

Next, in a third phase of methods according to the preferred embodiments, loops formed by the spacers 175 are etched. This etch preferably forms two separate lines of spacers 175 corresponding to two separate conductive paths in the substrate 110. It will be appreciated that more than two lines can be formed, if desired, by etching the spacers 175 at more than two locations.

To form the separate lines, a protective mask is formed over parts of the lines to be retained and the exposed, unprotected parts of the line are then etched. The protective mask is then removed to leave a plurality of electrically separated lines.

Figure 17:
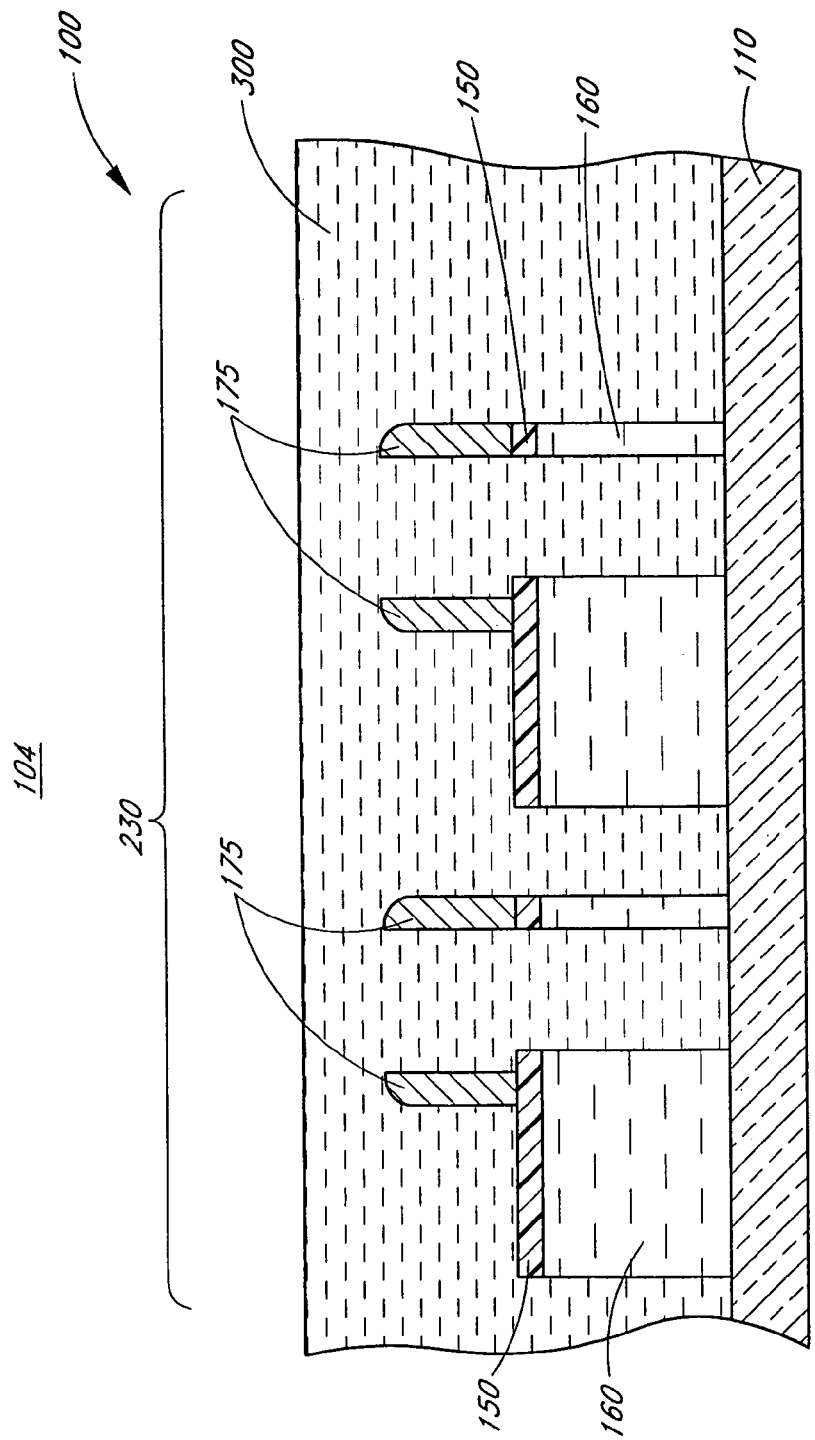
FIG. 17 is a schematic, cross-sectional side view of the partially formed memory device of FIGS. 16A and 16B after forming a protective layer over and around the landing pad pattern and the spacer pattern, in accordance with preferred embodiments of the invention.
Figure 18:
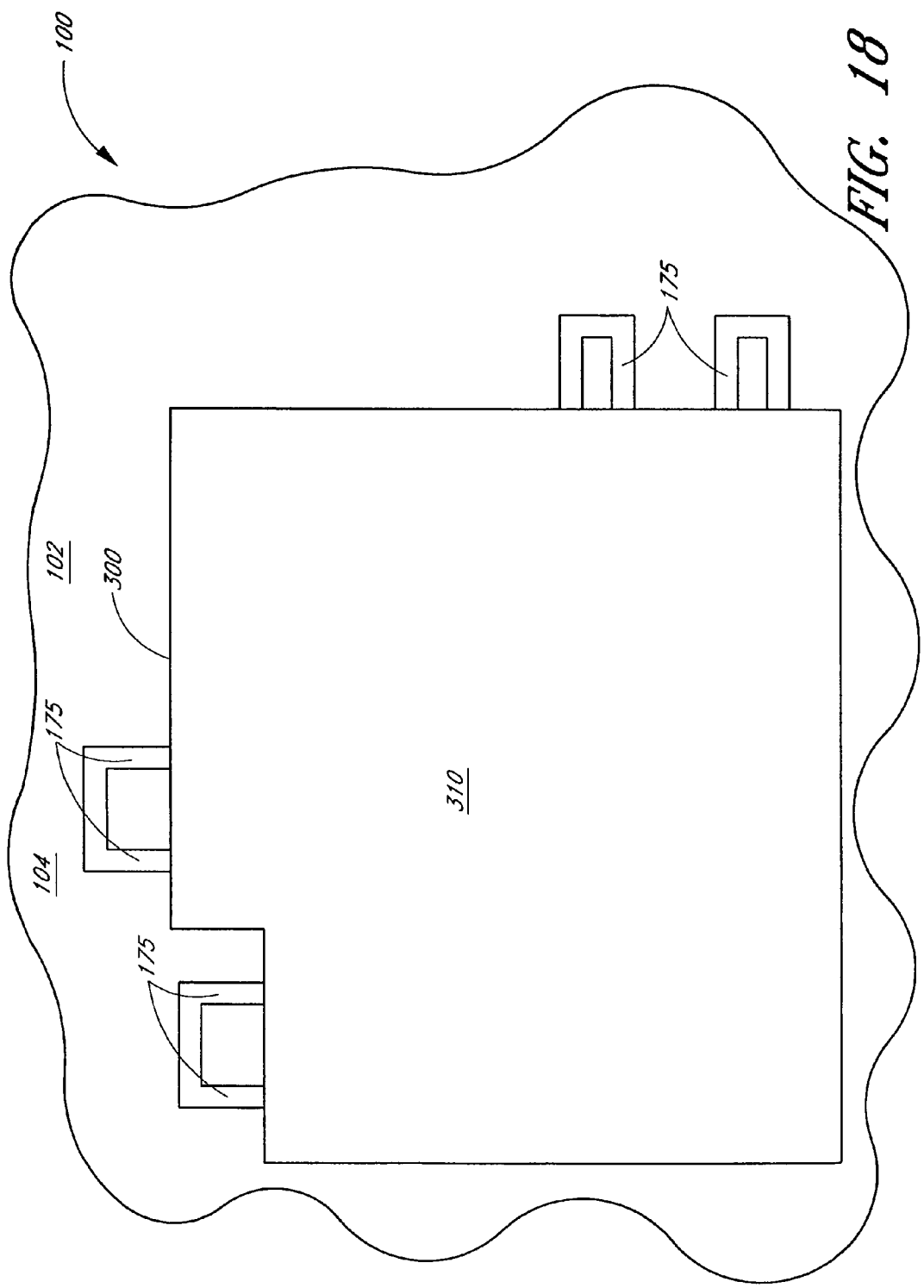
FIG. 18 is a schematic, top plan view of the partially formed memory device of FIG. 17 after patterning the protective layer, in accordance with preferred embodiments of the invention.

With reference to FIG. 17, a protective material forming a second protective layer 300 is preferably deposited around and over the spacers 175 and the parts of the layers 150 and 160 forming the pattern 230. The protective material is preferably a photodefinable material such as photoresist. Optionally, an anti-reflective coating (not shown) can be provided under the layer 300, e.g., directly above the substrate 110, to improve photolithography results. The photoresist and the anti-reflective coating can be deposited using various methods known in the art, including spin-on-coating processes. With reference to FIG. 18, a protective mask 310 is subsequently patterned in the second protective layer 300, e.g., by photolithography, to protect desired parts of the underlying pattern 230 from a subsequent etch. To separate the spacers 175 of one loop into two separate lines, portions of the loops are exposed for etching in at least two separate locations. To simplify processing, the exposed portions of the loops are preferably the ends of the loops formed by the spacers 175, as illustrated.

In other embodiments, it will be appreciated that the protective layer 300 can be formed of any material that can be selectively removed, e.g., relative to the spacers 175, the layers 150-160 and the substrate 110. In those cases, the protective mask 310 can be formed in another material, e.g., photoresist, overlying the layer 300.

Advantageously, where the ends of the spacers 175 extend in a straight line, the length and simple geometry of the straight lines can minimize the precision required for forming the protective mask 310; that is, the protective mask need only be formed so that it leaves the ends of the spacers 175 exposed. Thus, by centering the mask a comfortable distance from the ends of the spacers 175, a misaligned mask may cause slightly more or less of the spacers 175 to be exposed, but can still accomplish the objective of leaving the ends exposed. Consequently, the margin of error for aligning the protective mask 310 is larger than if the mask 310 where required to form a geometrically complex shape that required specific parts of the shape to be aligned with specific parts of the spacers 175. Moreover, the spacers 175 can be formed longer to further increase the margin of error for aligning the protective mask 310.

Figure 20B:
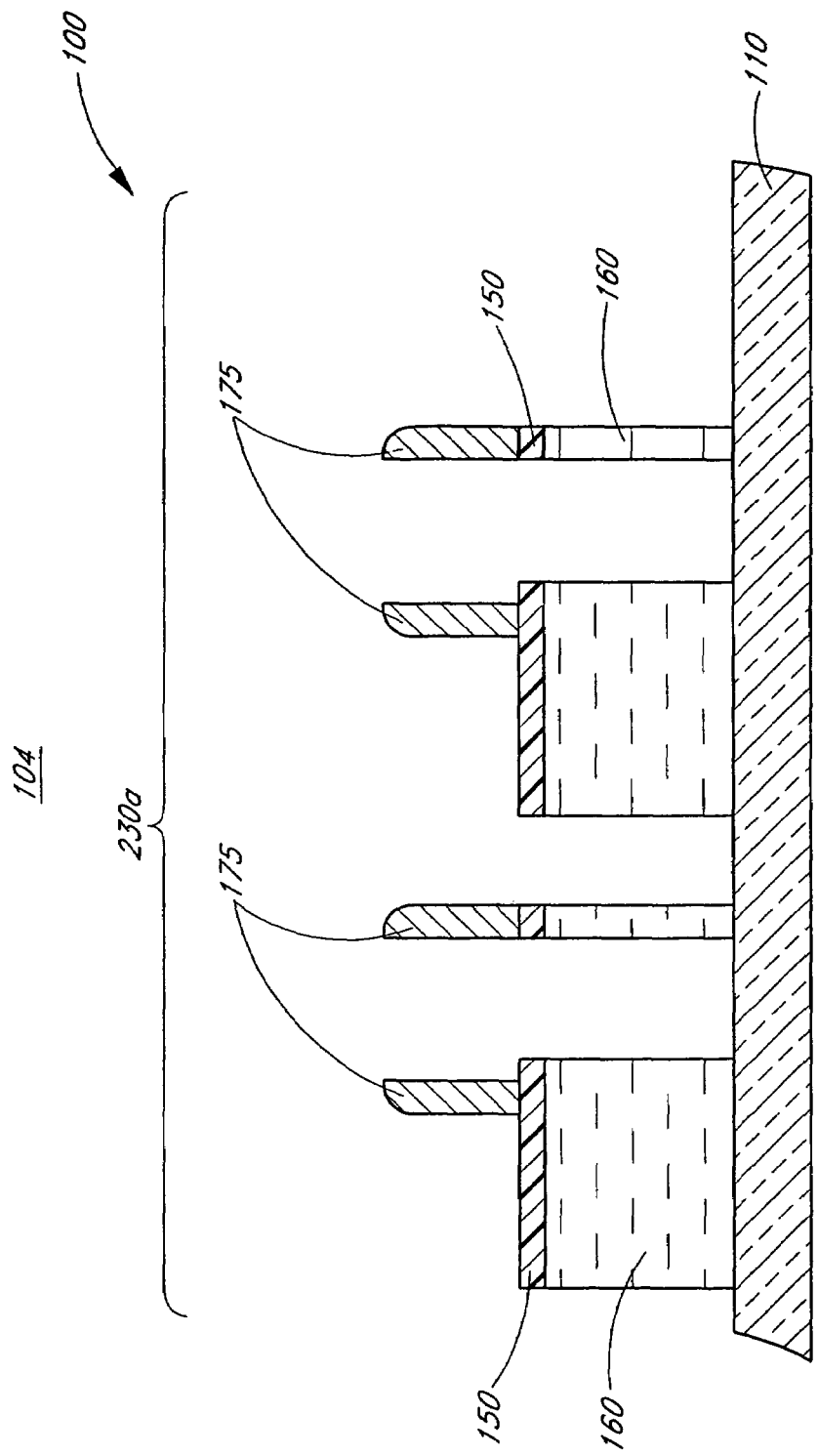

With reference to FIG. 19, the exposed portions of the spacers 175 are etched away. Where the spacers 175 comprise silicon oxide or nitride, preferred etch chemistries include a fluorocarbon etch or in the case of spacers 175 formed of an oxide, such as silicon oxide, the extruded loops can be etched using a wet chemistry, e.g., a buffered oxide etch. After being etched, the spacers 175 no longer form a loop with a neighboring spacer 175, as shown in FIG. 20A. The etched spacers 175 thus form a modified pattern 230a. FIG. 20B shows a side view of the resulting structure, taken along the vertical plane 20A of FIG. 20A.

With reference to FIGS. 20A and 20B, the protective material is preferably selectively removed. Where the material is photoresist or BARC, preferred etch chemistries include anisotropic etches, such as with a $SO_2$-containing plasma. In other embodiments, the partially formed integrated circuit 100 can be subjected to an ash process to remove the protective material. It will be appreciated that the spacers 175 are not attacked during this removal step and that the layer 160 is protected by the second hard mask layer 150.

Figure 21A:
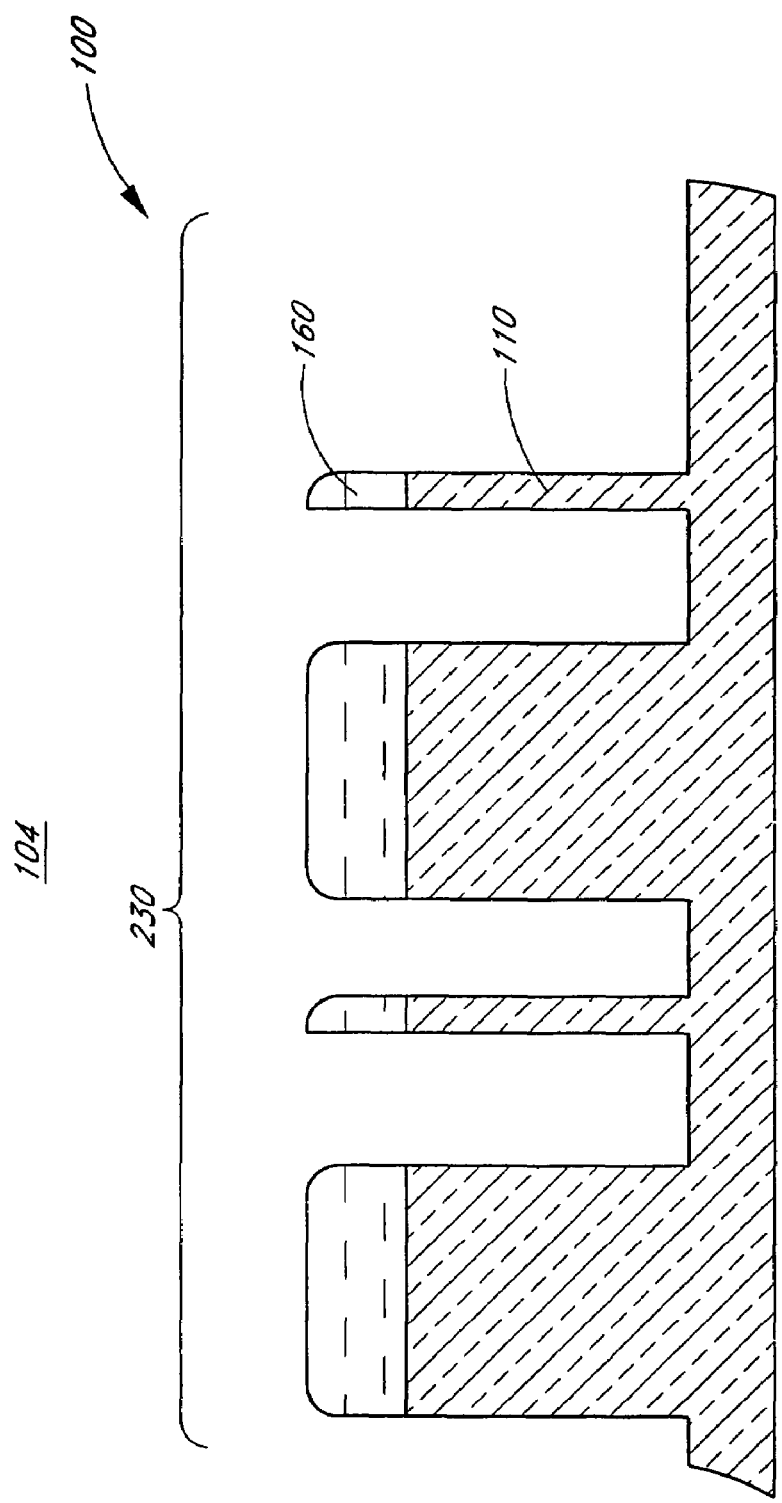

With reference to FIGS. 21A and 21B, the modified pattern 230a is transferred to the substrate 110 using the spacers 175 and the layers 150 and 160 as a mask. Given the disparate materials typically used for the additional hard mask layer 160 and the substrate 110 (e.g., amorphous carbon and silicon or silicon compounds, respectively), the pattern transfer can be readily accomplished using conventional etches appropriate for the material or materials of the substrate 110. Advantageously, any etch chemistry appropriate for the substrate material(s) is can be used. For example, where the substrate comprises an insulator, such as silicon oxide, a fluorocarbon etch comprising $CF_4$ or $C_2F_6$ can be used to etch the substrate. Where the substrate comprises polysilicon, a $HBr/Cl_2$ etch can be used. In addition, the skilled artisan can readily determine suitable etch chemistries for other substrate materials, such as conductors, including aluminum, transition metals, and transition metal nitrides. For example, an aluminum substrate can be etched using a fluorocarbon etch.

Where the substrate 110 comprises layers of different materials, a succession of different chemistries, preferably dry-etch chemistries, can be used to successively etch through the different layers. It will be appreciated that, depending upon the chemistry or chemistries used, the spacers 175 and the hard mask layer 150 may be etched, as shown in FIG. 21A. Amorphous carbon of the additional hard mask layer 160, however, advantageously offers excellent resistance to conventional etch chemistries, especially those used for etching silicon-containing materials. Accordingly, the additional hard mask layer 160 can effectively be used as a mask for etching through a plurality of substrate layers, or for forming high aspect ratio trenches. The additional hard mask layer 160 can later be removed for further processing of the substrate 110.

Thus, with reference to FIG. 21B, the pattern of lines 400 and landing pads 410 can be formed in the integrated circuit 100. Where the substrate 110 is a conductor (e.g., doped semiconductor or metallic materials), the lines 400 can be interconnect lines, e.g., for connecting memory cells in the array of a memory device to the landing pads 410. In addition, while landing pads 410 are illustrated, the preferred embodiments allow any structure to be contacted to the lines 400. For example, larger width interconnects (not shown) can be patterned and directly contacted to the lines 400. Note that the etched surfaces exhibit exceptionally low edge roughness.

It will be appreciated that formation of contacts according to the preferred embodiments offers numerous advantages. For example, the widened lines facilitate connection of interconnects with larger structures, including, e.g., landing pads and larger line width interconnects, by improving alignment tolerances. The increased distance between neighboring lines increases margins for gap fill and/or reduces capacitive coupling between unrelated lines. Moreover, the angling of the lines allow for closer packing of features such as landing pads.

Also, the surfaces of trenches and lines in substrates formed according to the preferred embodiments exhibit exceptionally low edge roughness. For example, for lines having a line width of about 50 nm, the edge roughness can be less than about 5 nm rms, and more preferably between about 1 nm and about 2 nm rms.

In addition, because multiple patterns, with different size features, can be consolidated on a single final mask layer before being transferred to a substrate, overlapping patterns can easily be transferred to the substrate. Thus, pitch-doubled features and features formed by conventional photolithography can easily be formed connected to each other. Moreover, noted above, exceptionally small features can be formed, while at the same time achieving exceptional and unexpectedly low line edge roughness. While not limited by theory, it is believed that such low line edge roughness is the result of consolidating mask patterns from multiple layers onto a single layer, such as the layer 160. Forming the spacers 175 and performing multiple anisotropic etches to transfer the pattern from the level of the temporary layer 140 to the additional hard mask layer 160 and then to the substrate 110 and forming and removing the second protective layer 300 are believed to beneficially smooth the surfaces of the mask features in the layer 160.

Moreover, the preferred amorphous carbon etch chemistries disclosed herein allow the use of thin hard mask layers, such as the layers 130 and 150, relative to the depth that underlying amorphous carbon layers, such as the layers 140 and 160, are etched. This advantageously reduces demands on the etch selectivity of materials used for the layers (e.g., photoresist layers) overlying the hard mask layers and also reduces demands on the chemistries used to etch the hard mask layers while at the same time ensuring that the additional hard mask layers form thick enough masks to withstand subsequent substrate etches.

It will also be appreciated that, in any of the steps described herein, transferring a pattern from a first level to a second level involves forming features in the second level that generally correspond to features on the first level. For example, the path of lines in the second level will generally follow the path of lines on the first level and the location of other features on the second level will correspond to the location of similar features on the first level. The precise shapes and sizes of features can vary from the first level to the second level, however. For example, depending upon etch chemistries and conditions, the sizes of and relative spacings between the features forming the transferred pattern can be enlarged or diminished relative to the pattern on the first level, while still resembling the same initial "pattern." Thus, the transferred pattern is still considered to be the same pattern as the initial pattern. In contrast, forming spacers around mask features can change the pattern.

It will also be appreciated that various modifications of the illustrated embodiments are possible. For example, in preferred embodiments, an objective of etching, or cutting, the loops of the spacers 175 is to form two or more separate conductors. However, the cutting step, including, e.g., protecting, masking and etching, can be performed after any number of steps in preferred process flows. For example, the spacer loops can be transferred to the substrate and the substrate is itself protected with a mask and the loops cut in the substrate itself. In other embodiments, the loops can be cut after various process steps, such as after formation of the spacers (e.g., FIG. 10A), after patterning of landing pads or other features (e.g. after any of steps illustrated in FIGS. 12-13), or after consolidating the spacer pattern and the pattern of the landing pads or other features onto a single level (e.g. after any of steps illustrated in FIGS. 14-20).

In a particularly advantageous embodiment, the loops can be cut before transferring the pattern 230 to the layer 160 (FIGS. 13-16B). With reference to FIG. 13, the pattern 230 is preferably transferred to the hard mask layer 150. Next, the material forming the features 202 can be removed. It will be appreciated that, to prevent etching the additional mask layer 160, the hard mask layer 150 can be supplemented with one or more additional layers of material. For example, an amorphous silicon layer and a silicon oxide layer can be used to separate the additional hard mask layer 160 and the spacers 175 and the material of the features 202. The protective layer 300 can then be deposited directly on the the spacers 175, the etched hard mask layer 150 and the un-etched additional hard mask layer 160. The protective mask 310 can then be formed, the loops cut, and the protective mask 310 can subsequently be removed. After removal of the mask 310, the modified (cut) pattern 230 can be transferred to the additional hard mask layer 160. Advantageously, by cutting the loops before forming deep trenches in the additional hard mask layer 160, the protective layer 300 is not deposited into deep trenches, thereby increasing the ease and completeness with which the mask 310 can later be removed.

In addition, the pitch of the spacers 175 can be more than doubled. For example, further pitch multiplication can be accomplished by forming additional spacers around the spacers 175, then removing the spacers 175, then forming spacers around the spacers that were formerly around the spacers the 175, and so on. An exemplary method for further pitch multiplication is discussed in U.S. Pat. No. 5,328,810 to Lowrey et al. Thus, the spacers 175 and the conductive lines formed from those spacers can have any desired pitch, including but not limited to about 200 nm or less and about 100 nm or less.

Moreover, more than two patterns, e.g., corresponding to landing pads and interconnects, can be consolidated on a mask layer before transferring the consolidated pattern to the substrate. In such cases, additional hard mask layers can be deposited between the layers 140 and 160. For example, patterns corresponding to landing pads and interconnects can be transferred to a supplemental mask layer (not shown) overlying the hard mask layer 150 and then the sequence of steps illustrated in FIGS. 11-14 can be performed to form the new pattern in an overlying photodefinable layer and to transfer the patterns to the substrate 110. The supplemental mask layer preferably comprises a material that can be selectively etched relative to the hard mask layer 150 and a protective layer (not shown) that surrounds the landing pads and interconnect patterns after being transferred to the supplemental mask layer. While illustrated with straight lines, it will be appreciated that the lines formed by the spacers 175 can follow any path, including an irregular weaving pattern.

Also, while "processing" through the various mask layers preferably involve etching an underlying layer, processing through the mask layers can involve subjecting layers underlying the mask layers to any semiconductor fabrication process.

In addition, the principles and advantages discussed herein are applicable to a variety of contexts in which two or more adjacent mask patterns are to be mated within overlapping regions.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for fabricating an integrated circuit, comprising:

forming a plurality of pairs of mask lines, wherein each pair of the mask lines forms a continuous loop;

patterning a substrate through a mask defined by the mask lines to form conductive lines in the substrate; and forming contact structures in contact with the conductive lines, wherein each contact structure contacts a different conductive line.

2. The method of claim 1, wherein forming contact structures comprises forming mask features for defining contact structures, wherein forming mask features comprises performing a photolithographic technique having a minimum pitch larger than a pitch of the plurality of pairs of mask lines.

3. The method of claim 1, wherein forming contact structures comprises forming mask features sized and positioned to define landing pads.

4. The method of claim 3, wherein forming mask features comprises patterning the mask features in a photoresist layer overlying the plurality of mask lines.

5. The method of claim 1, wherein forming the plurality of lines comprises forming the lines by pitch multiplication, wherein pitch multiplication comprises:

providing a plurality of mandrels over the substrate;

blanket depositing a layer of spacer material over the mandrels; and anisotropically etching the spacer material to form spacers on sidewalls of the mandrels, wherein the spacers constitute the mask lines.

6. The method of claim 1, further comprising forming two separate lines from each pair of the plurality of mask lines by etching ends of the loops formed by the pairs of mask lines.

7. The method of claim 6, wherein etching ends of the loops, comprises:

depositing a photodefinable material over the mask lines;

patterning the photodefinable material to expose the ends of the loops formed by the pairs of mask lines; and selectively removing the exposed ends.

8. The method of claim 6, wherein forming contact structures comprises forming mask features for defining contact structures after forming the plurality of pairs of mask lines and before etching ends of the loops.

9. The method of claim 8, wherein forming mask features for defining contact structures, comprises:

forming a pattern of mask features for defining contact structures in a photodefinable layer overlying the mask lines; and transferring the pattern of mask features for defining contact structures to the same level as the mask lines.

10. The method of claim 1, wherein patterning the substrate forms conductive lines in a memory device, wherein the lines are separated by a first width in an array region of the memory device and a second width in a periphery of the memory device, wherein the second width is larger than the first width.

11. The method of claim 10, wherein the lines extend in spaced, generally parallel relation to one another between first and second spaced planes extending perpendicular to the lines in at least the array region.

12. The method of claim 10, wherein the second width is about 1.5 to 3 times the first width.

13. The method of claim 10, wherein patterning the substrate forms conductive lines having a part of each conductive line in the periphery extending at an angle from a part of the conductive line in the array.

14. The method of claim 13, wherein the angle is about 30-90°.

15. The method of claim 13, wherein the conductive lines comprise word lines.

16. The method of claim 13, wherein the conductive lines comprise bit lines.

17. The method of claim 13, wherein the conductive lines comprise active areas in a continuous linear pattern.

18. The method of claim 13, wherein the conductive lines comprise active areas in a weaving pattern.

19. The memory device of claim 1, wherein patterning the substrate forms conductive lines each having an edge roughness less than about 5 nm rms.

20. The memory device of claim 19, wherein patterning the substrate forms conductive lines each having a width of about 50 nm.

21. The memory device of claim 19, wherein the edge roughness is between about 1-2 nm rms.

22. The method of claim 1, wherein the mask lines comprise silicon oxide or silicon nitride.

23. The method of claim 1, wherein forming contact structures forms a single contact structure in contact with each line.

* * * * *